United States Patent
Meir et al.

(10) Patent No.: US 11,881,973 B1
(45) Date of Patent: Jan. 23, 2024

(54) MULTI-LEVEL BALANCED CODE FOR WIRELESS COMMUNICATIONS

(71) Applicant: QUALCOMM Incorporated, San Diego, CA (US)

(72) Inventors: Elad Meir, Ramat Gan (IL); Gideon Shlomo Kutz, Ramat Hasharon (IL); Ram Krips, Ramat Gan (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/049,540

(22) Filed: Oct. 25, 2022

(51) Int. Cl.
| | |
|---|---|
| *H04B 17/309* | (2015.01) |
| *H04L 25/49* | (2006.01) |
| *H03M 5/20* | (2006.01) |
| *H04L 65/1045* | (2022.01) |

(52) U.S. Cl.
CPC .......... *H04L 25/4919* (2013.01); *H03M 5/20* (2013.01); *H04L 65/1045* (2022.05)

(58) Field of Classification Search
CPC ... H04L 1/0071; H04L 1/0057; H04L 1/0065; H04L 1/005; H04L 1/0045; H04L 27/2649; H04L 1/0059; H04L 1/004; H04B 17/309; H04B 7/0669; H04B 7/0671; H04B 7/0891; H04B 1/7097; H04B 1/7107; H04B 1/71072; H04B 1/71075; H04W 24/02; H04W 24/08; H04W 72/046; H04W 36/28; H04W 36/30; H04W 72/542; H04W 48/16; H04W 84/18
USPC ........................................................ 375/262
See application file for complete search history.

(56) References Cited

U.S. PATENT DOCUMENTS

| | | | |
|---|---|---|---|
| 8,422,589 B2 * | 4/2013 | Golitschek Edler Von Elbwart | H04L 25/0226 375/295 |
| 8,792,594 B2 * | 7/2014 | Vojcic | H03M 13/1515 375/348 |
| 11,799,700 B1 * | 10/2023 | Yang | H04L 1/0058 |
| 2008/0219343 A1 * | 9/2008 | Wu | H04L 25/0228 375/232 |
| 2018/0335501 A1 * | 11/2018 | Chen | G01S 5/0018 |
| 2022/0052887 A1 * | 2/2022 | Levitsky | H04L 25/4917 |

* cited by examiner

*Primary Examiner* — Eva Y Puente
(74) *Attorney, Agent, or Firm* — Harrity & Harrity, LLP

(57) ABSTRACT

Various aspects of the present disclosure generally relate to wireless communication. In some aspects, a user equipment (UE) may receive data encoded based on a multi-level balanced code, codewords of the multi-level balanced code being selected based on a finite number of multiple sum values, corresponding to all constellation symbol sequences in the multi-level balanced code. The UE may receive a superimposed pilot (SIP) using communication resources occupied by the data. The UE may estimate one or more channel parameters based on the SIP and the multi-level balanced code. Numerous other aspects are described.

30 Claims, 12 Drawing Sheets

MULTI-LEVEL BALANCED CODE FOR WIRELESS COMMUNICATIONS

FIELD OF THE DISCLOSURE

Aspects of the present disclosure generally relate to wireless communication and to techniques and apparatuses for a multi-level balanced code for wireless communications.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more network nodes that support communication for wireless communication devices, such as a user equipment (UE) or multiple UEs. A UE may communicate with a network node via downlink communications and uplink communications. "Downlink" (or "DL") refers to a communication link from the network node to the UE, and "uplink" (or "UL") refers to a communication link from the UE to the network node. Some wireless networks may support device-to-device communication, such as via a local link (e.g., a sidelink (SL), a wireless local area network (WLAN) link, and/or a wireless personal area network (WPAN) link, among other examples).

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a user equipment (UE) for wireless communication. The UE may include a memory and one or more processors coupled to the memory. The one or more processors may be configured to receive data encoded based on a multi-level balanced code, codewords of the multi-level balanced code being selected based on a finite number of multiple sum values, corresponding to all constellation symbol sequences in the multi-level balanced code. The one or more processors may be configured to receive a superimposed pilot (SIP) using communication resources occupied by the data. The one or more processors may be configured to estimate one or more channel parameters based on the SIP and the multi-level balanced code.

Some aspects described herein relate to a network node for wireless communication. The network node may include a memory and one or more processors coupled to the memory. The one or more processors may be configured to transmit data associated with a UE, the data being encoded based on a multi-level balanced code, codewords of the multi-level balanced code being selected based on a finite number of multiple sum values, corresponding to all constellation symbol sequences in the multi-level balanced code. The one or more processors may be configured to transmit a SIP using communication resources occupied by the data.

Some aspects described herein relate to a method of wireless communication performed by a UE. The method may include receiving data encoded based on a multi-level balanced code, codewords of the multi-level balanced code being selected based on a finite number of multiple sum values, corresponding to all constellation symbol sequences in the multi-level balanced code. The method may include receiving a SIP using communication resources occupied by the data. The method may include estimating one or more channel parameters based on the SIP and the multi-level balanced code.

Some aspects described herein relate to a method of wireless communication performed by a network node. The method may include transmitting data associated with a UE, the data being encoded based on a multi-level balanced code, codewords of the multi-level balanced code being selected based on a finite number of multiple sum values, corresponding to all constellation symbol sequences in the multi-level balanced code. The method may include transmitting a SIP using communication resources occupied by the data.

Some aspects described herein relate to a non-transitory computer-readable medium that stores a set of instructions for wireless communication by a UE. The set of instructions, when executed by one or more processors of the UE, may cause the UE to receive data encoded based on a multi-level balanced code, codewords of the multi-level balanced code being selected based on a finite number of multiple sum values, corresponding to all constellation symbol sequences in the multi-level balanced code. The set of instructions, when executed by one or more processors of the UE, may cause the UE to receive a SIP using communication resources occupied by the data. The set of instructions, when executed by one or more processors of the UE, may cause the UE to estimate one or more channel parameters based on the SIP and the multi-level balanced code.

Some aspects described herein relate to a non-transitory computer-readable medium that stores a set of instructions for wireless communication by a network node. The set of instructions, when executed by one or more processors of the network node, may cause the network node to transmit data associated with a UE, the data being encoded based on a multi-level balanced code, codewords of the multi-level balanced code being selected based on a finite number of multiple sum values, corresponding to all constellation symbol sequences in the multi-level balanced code. The set of instructions, when executed by one or more processors of the network node, may cause the network node to transmit a SIP using communication resources occupied by the data.

Some aspects described herein relate to an apparatus for wireless communication. The apparatus may include means for receiving data encoded based on a multi-level balanced code, codewords of the multi-level balanced code being selected based on a finite number of multiple sum values, corresponding to all constellation symbol sequences in the multi-level balanced code. The apparatus may include means for receiving a SIP using communication resources occupied by the data. The apparatus may include means for estimating one or more channel parameters based on the SIP and the multi-level balanced code.

Some aspects described herein relate to an apparatus for wireless communication. The apparatus may include means for transmitting data associated with a UE, the data being encoded based on a multi-level balanced code, codewords of the multi-level balanced code being selected based on a finite number of multiple sum values, corresponding to all constellation symbol sequences in the multi-level balanced code. The apparatus may include means for transmitting a SIP using communication resources occupied by the data.

Aspects generally include a method, apparatus, system, computer program product, non-transitory computer-readable medium, user equipment, base station, network entity, network node, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
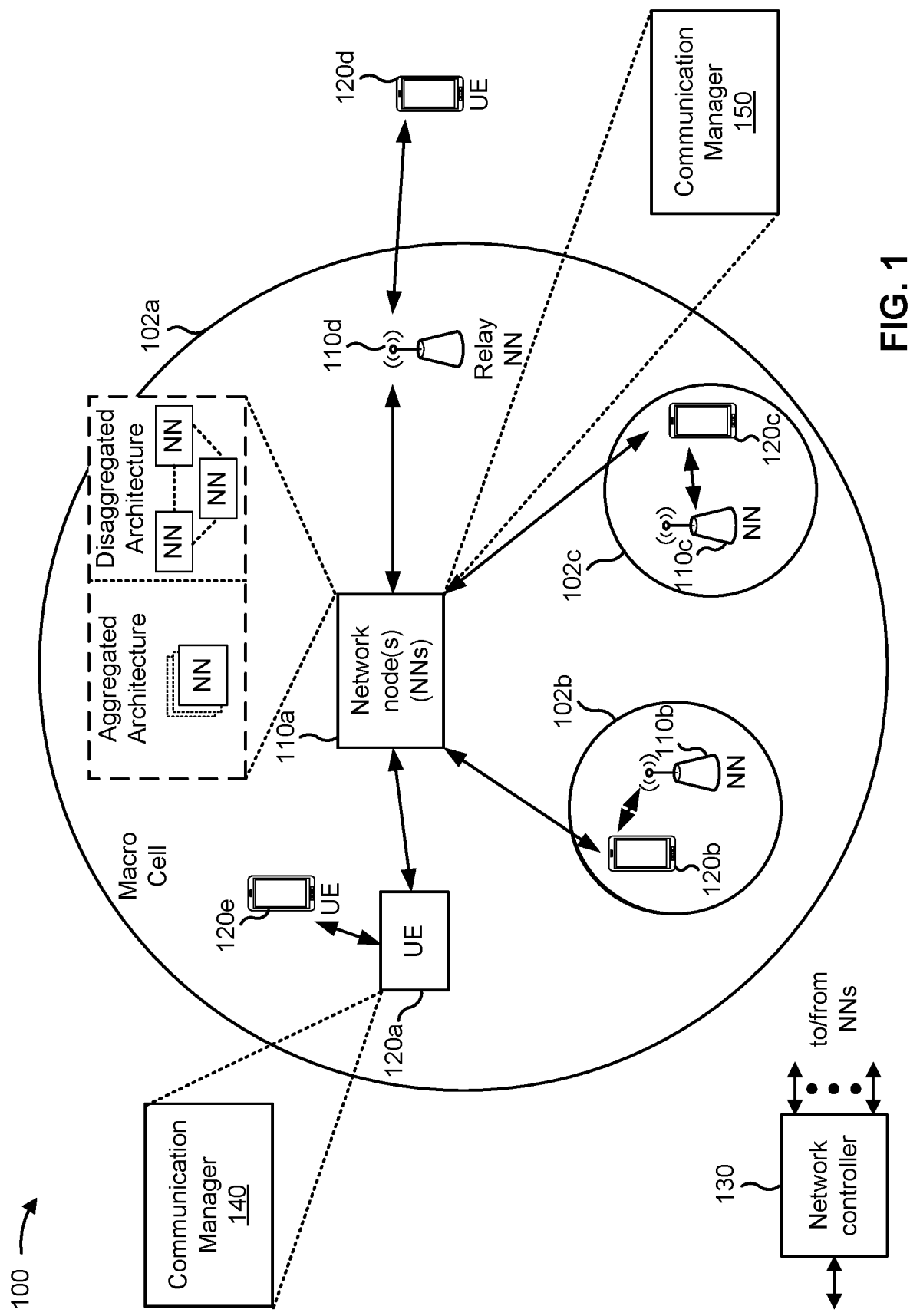
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more network nodes 110 (shown as a network node 110a, a network node 110b, a network node 110c, and a network node 110d), a user equipment (UE) 120 or multiple UEs 120 (shown as a UE 120a, a UE 120b, a UE 120c, a UE 120d, and a UE 120e), and/or other entities. A network node 110 is a network node that communicates with UEs 120. As shown, a network node 110 may include one or more network nodes. For example, a network node 110 may be an aggregated network node, meaning that the aggregated network node is configured to utilize a radio protocol stack that is physically or logically integrated within a single radio access network (RAN) node (e.g., within a single device or unit). As another example, a network node 110 may be a disaggregated network node (sometimes referred to as a disaggregated base station), meaning that the network node 110 is configured to utilize a protocol stack that is physically or logically distributed among two or more nodes (such as one or more central units (CUs), one or more distributed units (DUs), or one or more radio units (RUs)).

In some examples, a network node 110 is or includes a network node that communicates with UEs 120 via a radio access link, such as an RU. In some examples, a network node 110 is or includes a network node that communicates with other network nodes 110 via a fronthaul link or a midhaul link, such as a DU. In some examples, a network node 110 is or includes a network node that communicates with other network nodes 110 via a midhaul link or a core network via a backhaul link, such as a CU. In some examples, a network node 110 (such as an aggregated network node 110 or a disaggregated network node 110) may include multiple network nodes, such as one or more RUs, one or more CUs, and/or one or more DUs. A network node 110 may include, for example, an NR base station, an LTE base station, a Node B, an eNB (e.g., in 4G), a gNB (e.g., in 5G), an access point, a transmission reception point (TRP), a DU, an RU, a CU, a mobility element of a network, a core network node, a network element, a network equipment, a RAN node, or a combination thereof. In some examples, the network nodes 110 may be interconnected to one another or to one or more other network nodes 110 in the wireless network 100 through various types of fronthaul, midhaul, and/or backhaul interfaces, such as a direct physical connection, an air interface, or a virtual network, using any suitable transport network.

In some examples, a network node 110 may provide communication coverage for a particular geographic area. In the Third Generation Partnership Project (3GPP), the term "cell" can refer to a coverage area of a network node 110 and/or a network node subsystem serving this coverage area, depending on the context in which the term is used. A network node 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (e.g., a home) and may allow restricted access by UEs 120 having association with the femto cell (e.g., UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In the example shown in FIG. 1, the network node 110a may be a macro network node for a macro cell 102a, the network node 110b may be a pico network node for a pico cell 102b, and the network node 110c may be a femto network node for a femto cell 102c. A network node may support one or multiple (e.g., three) cells. In some examples, a cell may not necessarily be stationary, and the geographic area of the cell may move according to the location of a network node 110 that is mobile (e.g., a mobile network node).

In some aspects, the term "base station" or "network node" may refer to an aggregated base station, a disaggregated base station, an integrated access and backhaul (IAB) node, a relay node, or one or more components thereof. For example, in some aspects, "base station" or "network node" may refer to a CU, a DU, an RU, a Near-Real Time (Near-RT) RAN Intelligent Controller (RIC), or a Non-Real Time (Non-RT) RIC, or a combination thereof. In some aspects, the term "base station" or "network node" may refer to one device configured to perform one or more functions, such as those described herein in connection with the network node 110. In some aspects, the term "base station" or "network node" may refer to a plurality of devices configured to perform the one or more functions. For example, in some distributed systems, each of a quantity of different devices (which may be located in the same geographic location or in different geographic locations) may be configured to perform at least a portion of a function, or to duplicate performance of at least a portion of the function, and the term "base station" or "network node" may refer to any one or more of those different devices. In some aspects, the term "base station" or "network node" may refer to one or more virtual base stations or one or more virtual base station functions. For example, in some aspects, two or more base station functions may be instantiated on a single device. In some aspects, the term "base station" or "network node"

may refer to one of the base station functions and not another. In this way, a single device may include more than one base station.

The wireless network 100 may include one or more relay stations. A relay station is a network node that can receive a transmission of data from an upstream node (e.g., a network node 110 or a UE 120) and send a transmission of the data to a downstream node (e.g., a UE 120 or a network node 110). A relay station may be a UE 120 that can relay transmissions for other UEs 120. In the example shown in FIG. 1, the network node 110d (e.g., a relay network node) may communicate with the network node 110a (e.g., a macro network node) and the UE 120d in order to facilitate communication between the network node 110a and the UE 120d. A network node 110 that relays communications may be referred to as a relay station, a relay base station, a relay network node, a relay node, a relay, or the like.

The wireless network 100 may be a heterogeneous network that includes network nodes 110 of different types, such as macro network nodes, pico network nodes, femto network nodes, relay network nodes, or the like. These different types of network nodes 110 may have different transmit power levels, different coverage areas, and/or different impacts on interference in the wireless network 100. For example, macro network nodes may have a high transmit power level (e.g., 5 to 40 watts) whereas pico network nodes, femto network nodes, and relay network nodes may have lower transmit power levels (e.g., 0.1 to 2 watts).

A network controller 130 may couple to or communicate with a set of network nodes 110 and may provide coordination and control for these network nodes 110. The network controller 130 may communicate with the network nodes 110 via a backhaul communication link or a midhaul communication link. The network nodes 110 may communicate with one another directly or indirectly via a wireless or wireline backhaul communication link. In some aspects, the network controller 130 may be a CU or a core network device, or may include a CU or a core network device.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, a UE function of a network node, and/or any other suitable device that is configured to communicate via a wireless or wired medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a network node, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a network node 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the network node 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the UE 120 may include a communication manager 140. As described in more detail elsewhere herein, the communication manager 140 may receive data encoded based on a multi-level balanced code, codewords of the multi-level balanced code being selected based on a finite number of multiple sum values, corresponding to all constellation symbol sequences in the multi-level balanced code; receive a superimposed pilot (SIP) using communication resources occupied by the data; and estimate one or more channel parameters based on the SIP and the multi-level balanced code. Additionally, or alternatively, the communication manager 140 may perform one or more other operations described herein.

In some aspects, the network node 110 may include a communication manager 150. As described in more detail elsewhere herein, the communication manager 150 may transmit data associated with a UE, the data being encoded based on a multi-level balanced code, codewords of the multi-level balanced code being selected based on a finite number of multiple sum values, corresponding to all constellation symbol sequences in the multi-level balanced code; and transmit a SIP using communication resources occupied by the data. Additionally, or alternatively, the communication manager 150 may perform one or more other operations described herein.

As indicated above, FIG. 1 is provided as an example. Other examples may differ from what is described with regard to FIG. 1.

Figure 2:
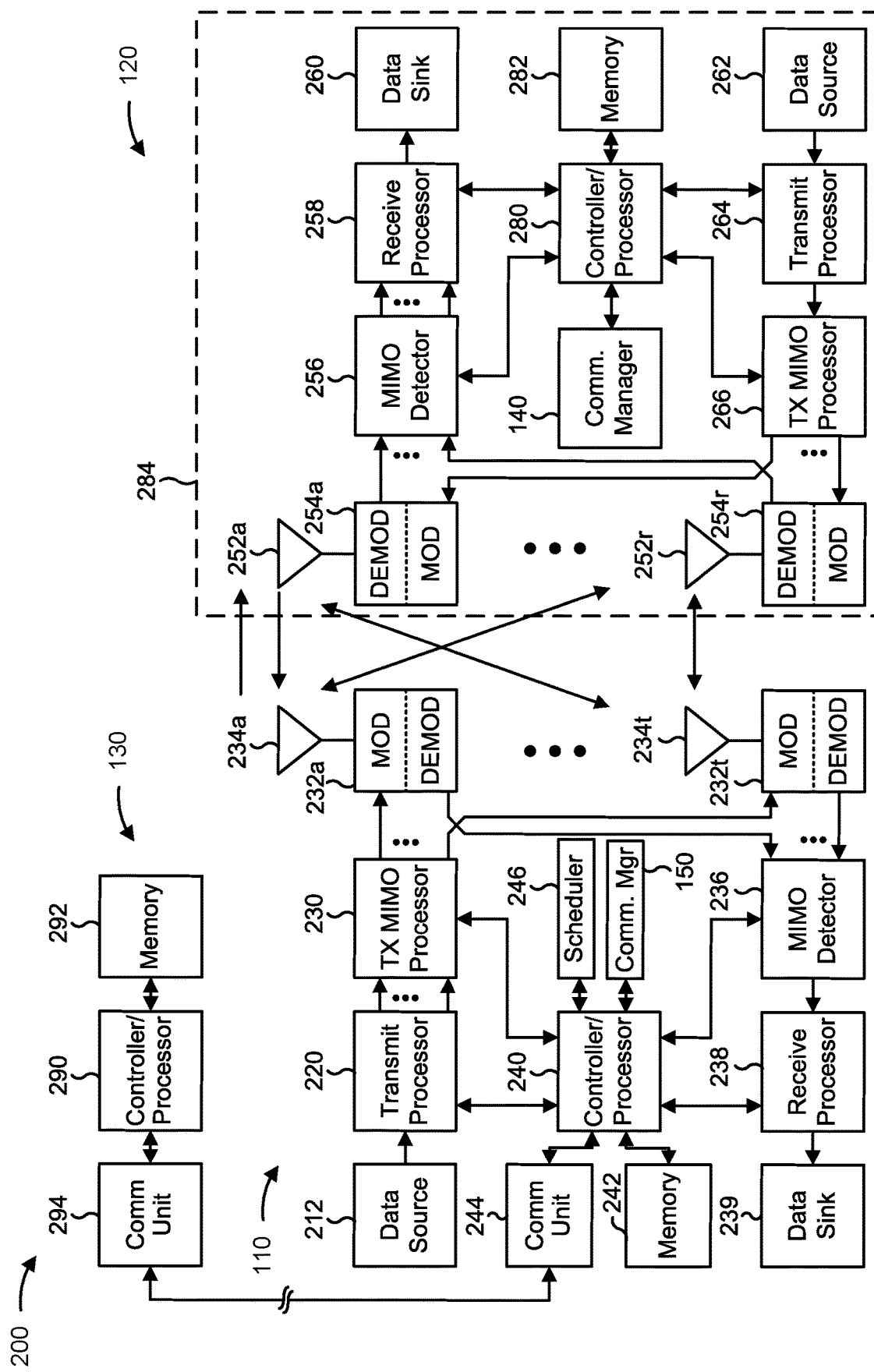
FIG. 2 is a diagram illustrating an example of a network node in communication with a user equipment (UE) in a wireless network, in accordance with the present disclosure.

FIG. 2 is a diagram illustrating an example 200 of a network node 110 in communication with a UE 120 in a wireless network 100, in accordance with the present disclosure. The network node 110 may be equipped with a set of antennas 234a through 234t, such as T antennas (T>1). The UE 120 may be equipped with a set of antennas 252a through 252r, such as R antennas (R>1). The network node 110 of example 200 includes one or more radio frequency components, such as antennas 234 and a modem 254. In some examples, a network node 110 may include an interface, a communication component, or another component that facilitates communication with the UE 120 or another network node. Some network nodes 110 may not include radio frequency components that facilitate direct communication with the UE 120, such as one or more CUs, or one or more DUs.

At the network node 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The network node 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the network node 110 and/or other network nodes 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the network node 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the network node 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 7-12).

At the network node 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The network node 110 may include a communication unit 244 and may communicate with the network controller 130 via the communication unit 244. The network node 110 may include a scheduler 246 to schedule one or more UEs 120 for downlink and/or uplink communications. In some examples, the modem 232 of the network node 110 may include a modulator and a demodulator. In some examples, the network node 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 7-12).

The controller/processor 240 of the network node 110, the controller/processor 280 of the UE 120, and/or any other component(s) of FIG. 2 may perform one or more techniques associated with a multi-level balanced code for wireless communications, as described in more detail elsewhere herein. For example, the controller/processor 240 of the network node 110, the controller/processor 280 of the UE 120, and/or any other component(s) of FIG. 2 may perform or direct operations of, for example, process 900 of FIG. 9, process 1000 of FIG. 10, and/or other processes as described herein. The memory 242 and the memory 282 may store data and program codes for the network node 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the network node 110 and/or the UE 120, may cause the one or more processors, the UE 120, and/or the network node 110 to perform or direct operations of, for example, process 900 of FIG. 9, process 1000 of FIG. 10, and/or other processes as described herein. In some examples, executing instructions may include running the instructions, converting the instructions, compiling the instructions, and/or interpreting the instructions, among other examples.

In some aspects, the UE 120 includes means for receiving data encoded based on a multi-level balanced code, codewords of the multi-level balanced code being selected based on a finite number of multiple sum values, corresponding to all constellation symbol sequences in the multi-level balanced code; means for receiving a SIP using communication resources occupied by the data; and/or means for estimating one or more channel parameters based on the SIP and the multi-level balanced code. The means for the UE 120 to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the network node 110 includes means for transmitting data associated with a UE, the data being encoded based on a multi-level balanced code, codewords of the multi-level balanced code being selected based on a finite number of multiple sum values, corresponding to all constellation symbol sequences in the multi-level balanced code; and/or means for transmitting a SIP using communication resources occupied by the data. The means for the network node 110 to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Deployment of communication systems, such as 5G NR systems, may be arranged in multiple manners with various components or constituent parts. In a 5G NR system, or network, a network node, a network entity, a mobility element of a network, a RAN node, a core network node, a network element, a base station, or a network equipment may be implemented in an aggregated or disaggregated architecture. For example, a base station (such as a Node B (NB), an evolved NB (eNB), an NR base station, a 5G NB, an access point (AP), a TRP, or a cell, among other examples), or one or more units (or one or more components) performing base station functionality, may be implemented as an aggregated base station (also known as a standalone base station or a monolithic base station) or a disaggregated base station. "Network entity" or "network node" may refer to a disaggregated base station, or to one or more units of a disaggregated base station (such as one or more CUs, one or more DUs, one or more RUs, or a combination thereof).

An aggregated base station (e.g., an aggregated network node) may be configured to utilize a radio protocol stack that is physically or logically integrated within a single RAN node (e.g., within a single device or unit). A disaggregated base station (e.g., a disaggregated network node) may be configured to utilize a protocol stack that is physically or logically distributed among two or more units (such as one or more CUs, one or more DUs, or one or more RUs). In some examples, a CU may be implemented within a network node, and one or more DUs may be co-located with the CU, or alternatively, may be geographically or virtually distributed throughout one or multiple other network nodes. The DUs may be implemented to communicate with one or more RUs. Each of the CU, DU and RU also can be implemented as virtual units, such as a virtual central unit (VCU), a virtual distributed unit (VDU), or a virtual radio unit (VRU), among other examples.

Base station-type operation or network design may consider aggregation characteristics of base station functionality. For example, disaggregated base stations may be utilized in an IAB network, an open radio access network (O-RAN (such as the network configuration sponsored by the O-RAN Alliance)), or a virtualized radio access network (vRAN, also known as a cloud radio access network (C-RAN)) to facilitate scaling of communication systems by separating base station functionality into one or more units that can be individually deployed. A disaggregated base station may include functionality implemented across two or more units at various physical locations, as well as functionality implemented for at least one unit virtually, which can enable flexibility in network design. The various units of the disaggregated base station can be configured for wired or wireless communication with at least one other unit of the disaggregated base station.

Figure 3:
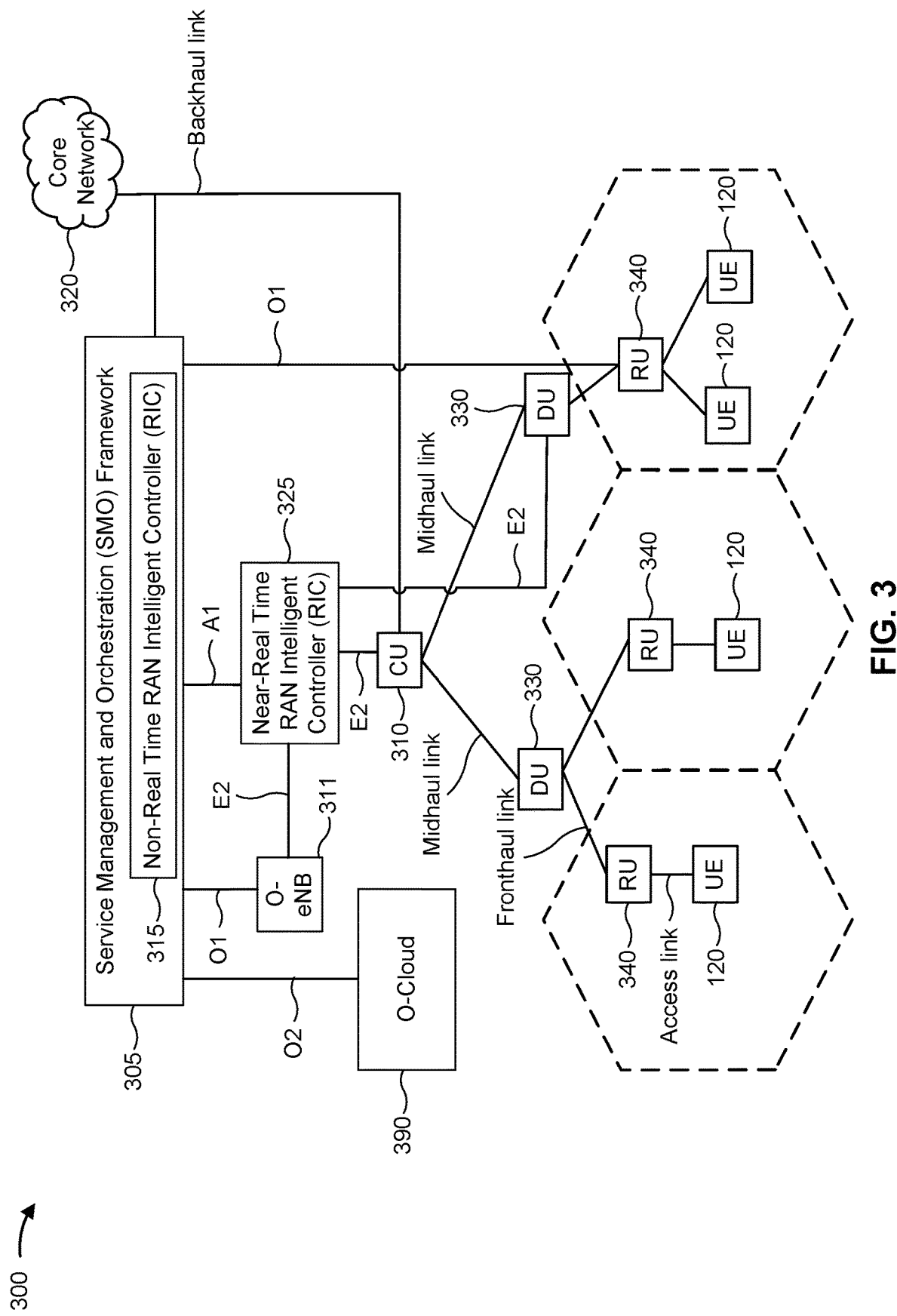
FIG. 3 is a diagram illustrating an example disaggregated base station architecture, in accordance with the present disclosure.

FIG. 3 is a diagram illustrating an example disaggregated base station architecture 300, in accordance with the present disclosure. The disaggregated base station architecture 300 may include a CU 310 that can communicate directly with a core network 320 via a backhaul link, or indirectly with the core network 320 through one or more disaggregated control units (such as a Near-RT RIC 325 via an E2 link, or a Non-RT RIC 315 associated with a Service Management and Orchestration (SMO) Framework 305, or both). A CU 310 may communicate with one or more DUs 330 via respective midhaul links, such as through F1 interfaces. Each of the DUs 330 may communicate with one or more RUs 340 via respective fronthaul links. Each of the RUs 340 may communicate with one or more UEs 120 via respective radio frequency (RF) access links. In some implementations, a UE 120 may be simultaneously served by multiple RUs 340.

Each of the units, including the CUs 310, the DUs 330, the RUs 340, as well as the Near-RT RICs 325, the Non-RT RICs 315, and the SMO Framework 305, may include one or more interfaces or be coupled with one or more interfaces configured to receive or transmit signals, data, or information (collectively, signals) via a wired or wireless transmission medium. Each of the units, or an associated processor or controller providing instructions to one or multiple communication interfaces of the respective unit, can be configured to communicate with one or more of the other units via the transmission medium. In some examples, each of the units can include a wired interface, configured to receive or transmit signals over a wired transmission medium to one or more of the other units, and a wireless interface, which may include a receiver, a transmitter or transceiver (such as an RF transceiver), configured to receive or transmit signals, or both, over a wireless transmission medium to one or more of the other units.

In some aspects, the CU 310 may host one or more higher layer control functions. Such control functions can include radio resource control (RRC) functions, packet data convergence protocol (PDCP) functions, or service data adaptation protocol (SDAP) functions, among other examples. Each control function can be implemented with an interface configured to communicate signals with other control functions hosted by the CU 310. The CU 310 may be configured to handle user plane functionality (for example, Central Unit—User Plane (CU-UP) functionality), control plane functionality (for example, Central Unit—Control Plane (CU-CP) functionality), or a combination thereof. In some implementations, the CU 310 can be logically split into one or more CU-UP units and one or more CU-CP units. A CU-UP unit can communicate bidirectionally with a CU-CP unit via an interface, such as the E1 interface when implemented in an O-RAN configuration. The CU 310 can be implemented to communicate with a DU 330, as necessary, for network control and signaling.

Each DU 330 may correspond to a logical unit that includes one or more base station functions to control the operation of one or more RUs 340. In some aspects, the DU 330 may host one or more of a radio link control (RLC) layer, a medium access control (MAC) layer, and one or more high physical (PHY) layers depending, at least in part, on a functional split, such as a functional split defined by the 3GPP. In some aspects, the one or more high PHY layers may be implemented by one or more modules for forward error correction (FEC) encoding and decoding, scrambling, and modulation and demodulation, among other examples. In some aspects, the DU 330 may further host one or more low PHY layers, such as implemented by one or more modules for a fast Fourier transform (FFT), an inverse FFT (iFFT), digital beamforming, or physical random access channel (PRACH) extraction and filtering, among other examples. Each layer (which also may be referred to as a module) can be implemented with an interface configured to communicate signals with other layers (and modules) hosted by the DU 330, or with the control functions hosted by the CU 310.

Each RU 340 may implement lower-layer functionality. In some deployments, an RU 340, controlled by a DU 330, may correspond to a logical node that hosts RF processing functions or low-PHY layer functions, such as performing an FFT, performing an iFFT, digital beamforming, or PRACH extraction and filtering, among other examples, based on a functional split (for example, a functional split defined by the 3GPP), such as a lower layer functional split. In such an architecture, each RU 340 can be operated to handle over the air (OTA) communication with one or more UEs 120. In some implementations, real-time and non-real-time aspects of control and user plane communication with the RU(s) 340 can be controlled by the corresponding DU 330. In some scenarios, this configuration can enable each DU 330 and the CU 310 to be implemented in a cloud-based RAN architecture, such as a vRAN architecture.

The SMO Framework 305 may be configured to support RAN deployment and provisioning of non-virtualized and virtualized network elements. For non-virtualized network elements, the SMO Framework 305 may be configured to support the deployment of dedicated physical resources for RAN coverage requirements, which may be managed via an operations and maintenance interface (such as an O1 interface). For virtualized network elements, the SMO Framework 305 may be configured to interact with a cloud computing platform (such as an open cloud (O-Cloud) platform 390) to perform network element life cycle management (such as to instantiate virtualized network elements) via a cloud computing platform interface (such as an O2 interface). Such virtualized network elements can include, but are not limited to, CUs 310, DUs 330, RUs 340, non-RT RICs 315, and Near-RT RICs 325. In some implementations, the SMO Framework 305 can communicate with a hardware aspect of a 4G RAN, such as an open eNB (O-eNB) 311, via an O1 interface. Additionally, in some implementations, the SMO Framework 305 can communicate directly with each of one or more RUs 340 via a respective O1 interface. The SMO Framework 305 also may include a Non-RT RIC 315 configured to support functionality of the SMO Framework 305.

The Non-RT RIC 315 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 325. The Non-RT RIC 315 may be coupled to or communicate with (such as via an A1 interface) the Near-RT RIC 325. The Near-RT RIC 325 may be configured to include a logical function that enables near-real-time control and optimization of RAN elements and resources via data collection and actions over an interface (such as via an E2 interface) connecting one or more CUs 310, one or more DUs 330, or both, as well as an O-eNB, with the Near-RT RIC 325.

In some implementations, to generate AI/ML models to be deployed in the Near-RT RIC 325, the Non-RT RIC 315 may receive parameters or external enrichment information from external servers. Such information may be utilized by the Near-RT RIC 325 and may be received at the SMO Framework 305 or the Non-RT RIC 315 from non-network data sources or from network functions. In some examples, the Non-RT RIC 315 or the Near-RT RIC 325 may be configured to tune RAN behavior or performance. For example, the Non-RT RIC 315 may monitor long-term trends and patterns for performance and employ AI/ML models to perform corrective actions through the SMO Framework 305 (such as reconfiguration via an O1 interface) or via creation of RAN management policies (such as A1 interface policies).

As indicated above, FIG. 3 is provided as an example. Other examples may differ from what is described with regard to FIG. 3.

Figure 4:
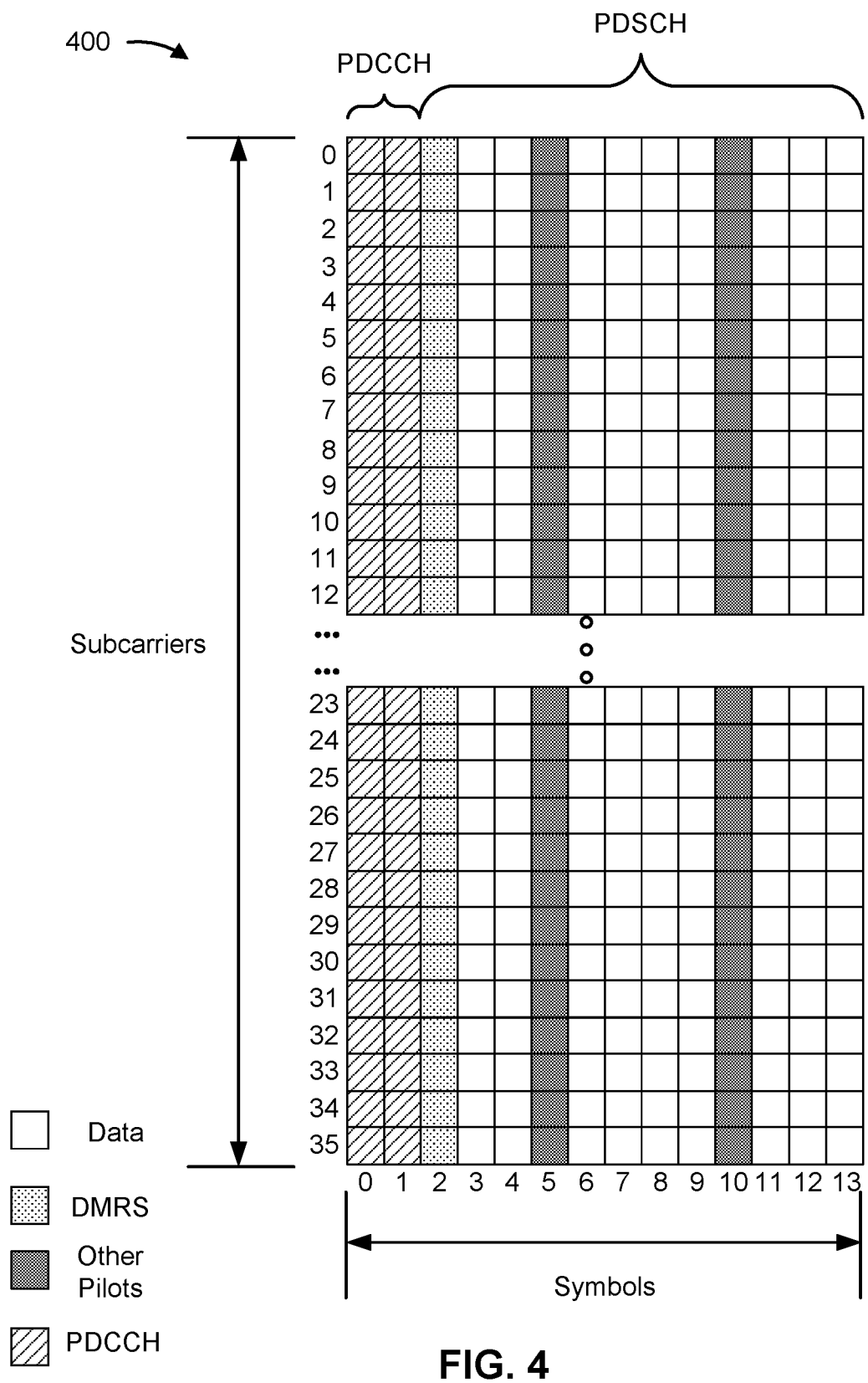
FIG. 4 is a diagram illustrating an example of pilots within time and frequency resources of a communication link, in accordance with the present disclosure.

FIG. 4 is a diagram illustrating an example 400 of pilots within time and frequency resources of a communication link, in accordance with the present disclosure. In some networks, a network node may transmit a downlink communication on a physical downlink shared channel (PDSCH) with data and DMRSs for estimating a channel of the PDSCH. The DMRSs may be used by the UE to improve reception (e.g., demodulating and/or decoding) of the data transmitted within the PDSCH.

As shown in FIG. 4, the network node may also transmit other pilots for measurement by other UEs, or by the UE in addition to the DMRSs. For example, the network node may transmit the other pilots for measurement as part of a beam management operation, a beam selection operation, a beam refinement operation, a handover operation, among other examples. The network node may transmit the other pilots on a same beam as the data (e.g., an active beam). As shown in FIG. 4, the other pilots may consume network resources that may have otherwise been allocated for communication of data.

As shown in FIG. 4, the communication may include physical downlink control channel (PDCCH) symbols (e.g., symbols 0 and 1) that are associated with the PDSCH. In addition to the PDCCH symbols, the DMRS (e.g., 1-4 symbols of DMRS) and the other pilots may consume a large portion of the resources of the communication. This may cause inefficient communications for the data, where, for example, approximately 40% or more of resources of the communication are unable to carry data because they are used to carry other signaling.

As indicated above, FIG. 4 is provided as an example. Other examples may differ from what is described with respect to FIG. 4.

Figure 5:
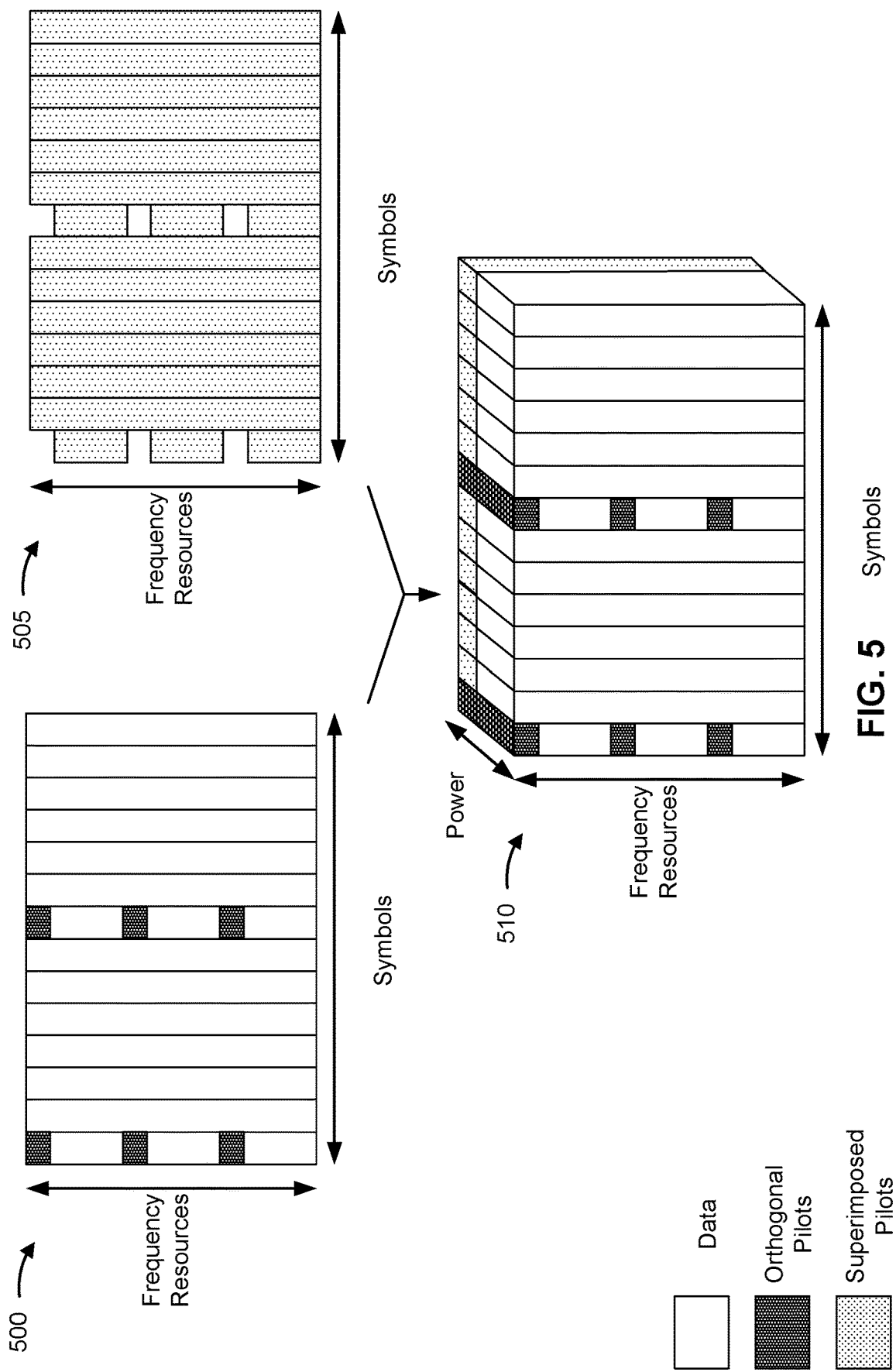
FIG. 5 is a diagram of an example associated with data signaling with superimposed pilots (SIPs), in accordance with the present disclosure.

FIG. 5 is a diagram of an example associated with data signaling with SIPs, in accordance with the present disclosure. In context of FIG. 5, a network node (e.g., a network node 110, a CU, a DU, and/or an RU) may communicate with a UE (e.g., UE 120). In some aspects, the network node and the UE may be part of a wireless network (e.g., the wireless network 100). The UE and the network node may have established a wireless connection prior to operations shown in FIG. 5. In some examples, the network may support multi-user MIMO (MU-MIMO) and/or dense-MU-MIMO.

For example, some networks may use large scale MU-MIMO to improve spectral efficiency, such as dense-MU-MIMO. Dense-MU-MIMO systems may use a relatively large number of Tx antennas to form a corresponding large number of beams, which may enable multiplexing of large number of users and improve spectrum utilization in a spatial domain. However, for Dense-MU-MIMO, determining a network node precoding matrix to optimize overall throughput and to minimize inter-user interference may pose a challenge.

For precoding adaptation, a channel from a large number of transmission antennas to all UEs should be estimated and reported. However, sending orthogonal reference signals from a large number of ports (e.g., beams) will reduce an overall bandwidth available for data (e.g., as discussed in context of FIG. 4). Using non-orthogonal pilots (e.g., in a MU-MIMO configuration) may results in pilot contamination, which reduces effectiveness of the pilots in improving communications with UEs. Efficient allocation of reference signal resources may be important for dense-MU-MIMO to ensure that sufficient resources are available to carry data.

In some networks, a channel from one network node to an i-th UE may be designated as a matrix $H_i$ with $R_i$ receive antenna elements and T transmit antenna elements. The precoded channel to the i-th UE will then be $H_i P_i$. A precoding matrix, $P_i$, may need to optimize a signal-to-noise ratio (SNR) for the i-th UE and minimize an interference for other UEs. A metric for the precoding matrix may be $$P_i = \text{argmax} \frac{P_i^H H_i^H H_i P_i}{\sum_{j \neq i} P_i^H H_j^H H_j P_i}$$

which leads to $P_i$ being dominant eigenvectors of $(\Sigma_{j \neq i} H_j^H H_j)^{-1} H_i^H H_i \rightarrow$ knowledge of $H_i^H H_i \forall i$ needs to be obtained to calculate the precoding matrix.

DMRS are one resource associated with estimating $H_i$. However, because DMRSs are precoded, the DMRSs may provide partial information about $H_i$ (the non precoded channel). To obtain additional information, more transmission ports may need to be sent as reference signals. This may be accomplished by channel state information reference signals (CSI-RSs), extended DMRSs, CRSs, and/or sounding reference signals (SRSs) if reciprocity is assumed. However, all these reference signals reduce an available bandwidth for data as they are multiplexed (in time and frequency) with the data.

In some aspects described herein, a network node may transmit a communication that includes data signaling and superimposed pilots, with the superimposed pilots being superimposed on the data signaling transmitted via one or more communication resources of the communication. In some aspects, the communication may include orthogonal DMRSs (e.g., with orthogonality to the data signaling) for channel estimation and/or data demodulation.

The superimposed pilots may include CSI-RSs, CRSs, and/or extended DMRS for estimation of a downlink precoder. The CSI-RSs, CRSs, and/or extended DMRSs may have a waveform that is different from a waveform of an orthogonal pilot. For example, the superimposed pilots may serve a function as a CSI-RSs, CRSs, and/or extended DMRSs without a conventional waveform used for orthogonal pilots. In some aspects, the superimposed pilots may be used by the UE and/or other UEs to perform one or more operations such as beam management, beam selection, beam refinement, or mobility operations.

In some examples, superimposed pilot ports (e.g., with a port associated with a beam) may be orthogonal between themselves. For example, the superimposed pilot ports may be orthogonal with each other based at least in part on multiplexing either in frequency, time, and/or code. In this way, only orthogonality to the data signaling may be lost. This configuration may avoid pilot contamination and allow an efficient receiver to separate the data and the superimposed pilots.

In contrast to the example of FIG. 4, the superimposed pilots are not orthogonal to the data signaling. For example, the superimposed pilots may share time and frequency resources and/or coding resources (e.g., orthogonal cover code (OCC) resources) with the data signaling (e.g., as depicted in FIG. 5). The superimposed pilots may be added on top of data symbols and may share a transmission power resource (e.g., the transmission power may be split between the superimposed pilots and the data signaling). No orthogonality is achieved, which may require added complexity for a receiver (e.g., at a UE).

In an example network, a capacity per resource element of a multiplexed pilot may be compared to a capacity per resource element of a superimposed pilot configuration. A capacity per resource element per slot may be estimated as $N*\log_2(1+SNR)$ where N is a number of available data symbols (e.g., PDSCH) in a slot. In this example we assume N=12. A number of ports (e.g., beams, virtual ports, digital ports, among other examples) that can be multiplexed in frequency depends on a channel coherence bandwidth. For the example, the communication has an assumed 12 channel ports multiplexed in frequency, which may represent a typical network having CSI-RS with a density of 1 resource element per resource block.

For multiplexed pilot configurations, a number of pilot ports comes at an expense of time and frequency resources. To accommodate the pilots, we set N=12-ports/12, which corresponds to a throughput estimated as $$\left(N - \frac{\text{ports}}{12}\right) * \log_2(1 + SNR).$$

For superimposed pilots, no resources are dedicated for only the superimposed pilots. Instead, a portion of signal power per resource element is used for the superimposed pilots. Maintaining the same power as for the multiplexed configuration, spreading the pilot over 12 symbols requires $\frac{1}{12}$ of the symbol power. Throughput is estimated with $$N * \log_2\left(1 + SNR * \left(1 - \frac{\text{ports}}{144}\right)\right)$$

where the 144 comes from multiplexing 12 ports in frequency and splitting the power over 12 symbols in time.

The two configurations (multiplexed pilots and superimposed pilots) can provide identical throughput in two cases—where there are no pilot ports and all resources are used for data, and where there are 144 pilot ports where all frequency and time resources are used for a channel estimation in a multiplexed pilot configuration case and where all power is used for the superimposed pilots in the superimposed configuration. In all intermediate cases 0<ports<144, the superimposed pilots may outperform the multiplexing configuration.

The example above illustrates a comparison between superimposed pilots and multiplexed pilots by maintaining a same pilot energy. However, the superimposed pilot configuration also exhibits more flexibility to assign arbitrary pilot to data power ratios and/or to adopt the superimposed pilots scheme for frequency and/or time selectivity of the channel and for an estimation quality needed for efficient communication.

In some aspects, a UE may report capability to support superimposed pilots. In some aspects, the network node may use superimposed pilots only if the UE has reported a capability to support the superimposed pilots. The capability may be partial support, such as support with a limitation on a number of superimposed ports and/or a type of superimposed pilots (e.g., superimposition with time (using, e.g., time division duplexing (TDD)), frequency (using, e.g., frequency division duplexing (FDD)), and/or coding), among other examples.

In some aspects, the UE may indicate support for, and/or the network node may indicate a configuration indicating, one or more parameters for the superimposed pilots. For example, the UE and/or the network node may indicate a pilot table (e.g., similar to CSI-RS configuration) that is associated with parameters including a number of ports for superimposed pilots, a span of symbols used for the superimposed pilots, a number of resource blocks that are used for the superimposed pilots, a type of superimposed pilots port multiplexing (e.g., frequency domain multiplexing, time domain multiplexing, code division multiplexing, or a mixed scheme), and/or a relative allocated power for superimposed pilots vs. data power (e.g., to assist in recurrent neural network (Rnn) calculations at the receiver), among other examples.

In some aspects, the network node may transmit a downlink control information (DCI) message to indicate existence of superimposed pilots and a pilot type of the superimposed pilots. Additionally, or alternatively, several options for superimposed pilots multiplexing may be signaled through RRC signaling and dynamic selection of a current type may be signaled in DCI.

Based at least in part on using superimposed pilots, the network may conserve network resources for data that may have otherwise been used to communicate orthogonal pilots. In this way, a network may support additional pilots, higher throughputs for a same number of pilots, and/or higher spectral efficiency.

For example, as shown by reference number 500, a communication may include resources allocated to data and resources allocated to orthogonal pilots (e.g., additional pilots and/or pilots of the active beam). For example, the orthogonal pilots may include DMRSs that the UE may use to estimate a channel for an active beam that carries the data. In some aspects, symbols having DMRSs may be designated as DMRS symbols. In some aspects, the communication may include one or more DMRS symbols. In some aspects, the data and the orthogonal pilots may be transmitted via an active beam.

As shown by reference number 505, the communication may include superimposed pilots. In some aspects, the superimposed pilots may include superimposed pilots associated with different pilot ports and/or beams. In some aspects, the superimposed pilots associated with different pilot ports and/or beams may be orthogonal. For example, a first set of the superimposed pilots associated with a first pilot port and/or a first beam may be carried on a different set of time and frequency resources than a second set of the superimposed pilots associated with a second pilot port and/or a second beam.

As shown by reference number 510, the communication may include the data and orthogonal pilots having the superimposed pilots superimposed thereon. In some aspects, the data and orthogonal pilots may be transmitted with more power than the superimposed pilots. In some aspects, the superimposed pilots may not be superimposed pilots on the orthogonal pilots and/or the orthogonal pilots may have a full allocation of transmission power. For example, the superimposed pilots may share an available transmission power with the data signaling transmitted via the one or more communication resources. For example, the network node may have a power limit P for each resource (e.g., resource element) of the communication. The network node may configure a first power P1 for transmitting the data signaling and a second power P2 for transmitting the superimposed pilots, where a sum of P1 and P2 is P. In some aspects, an amount of power allocated to the data signaling PI is based at least in part on a number of ports for the superimposed pilots.

As indicated above, FIG. 5 is provided as an example. Other examples may differ from what is described with respect to FIG. 5. For example, instead of orthogonal pilots, the network node may transmit pilots for channel estimation (e.g., pilots transmitted via an active beam) as superimposed pilots on a subset of the data. In some aspects, the pilots for channel estimation may be a set of the superimposed pilots.

Figure 6:
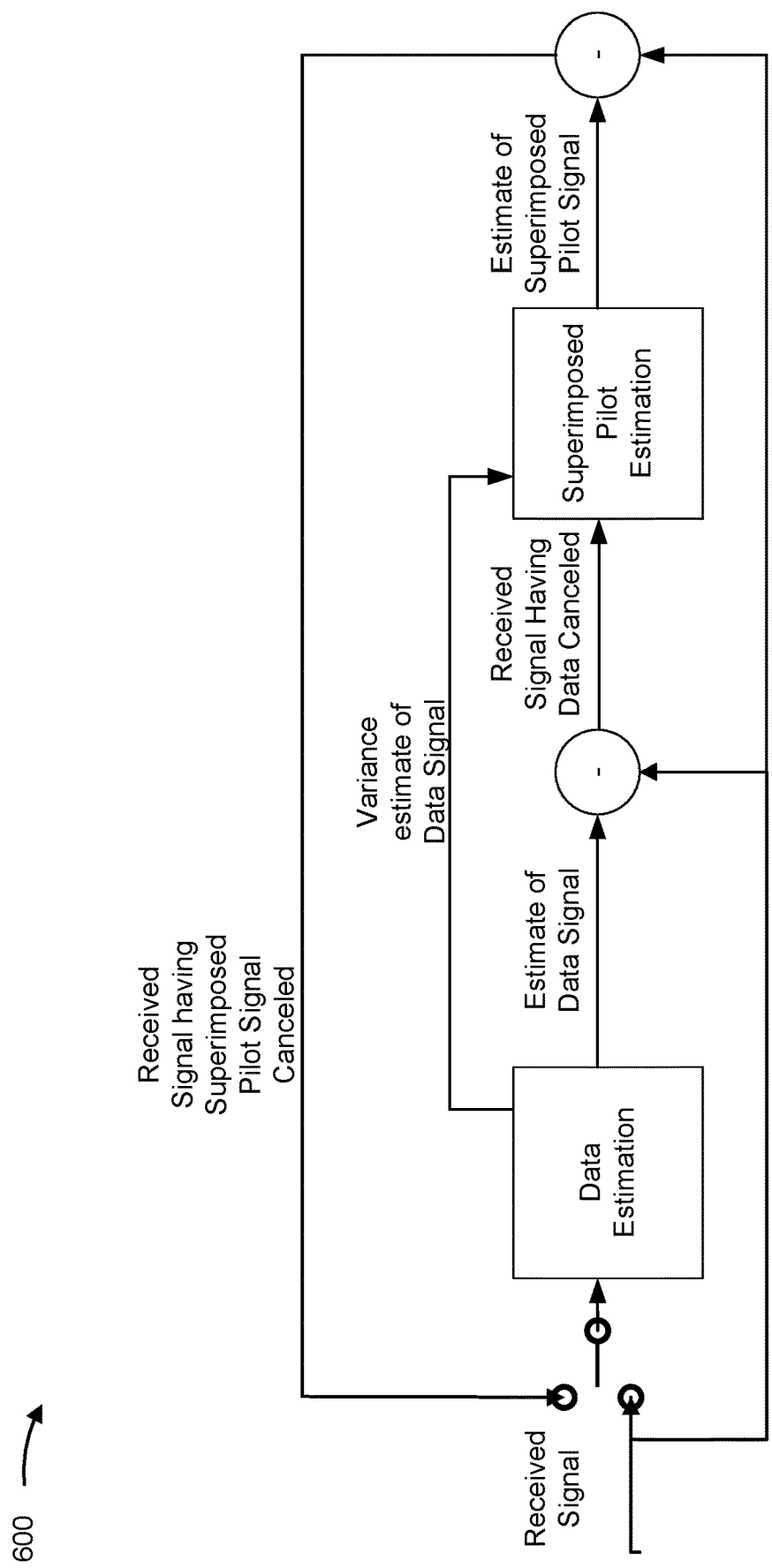
FIG. 6 is a diagram of an example associated with data signaling with superimposed pilots, in accordance with the present disclosure.

FIG. 6 is a diagram of an example 600 associated with data signaling with superimposed pilots, in accordance with the present disclosure. In context of FIG. 6, a network node (e.g., network node 110, a CU, a DU, and/or an RU) may communicate with a UE (e.g., UE 120). In some aspects, the network node and the UE may be part of a wireless network (e.g., wireless network 100). The UE and the network node may have established a wireless connection prior to operations shown in FIG. 6. In some aspects, the network may support MU-MIMO and/or dense-MU-MIMO.

A receiving device (e.g., a UE) may need to separate the superimposed pilots from the data signaling to decode the signaling. This may be done by an iterative cancellation algorithm that jointly estimates the channel ports (e.g., the superimposed pilots) and the data. For example, the receiving device may use minimum mean square error (MMSE) estimations iteratively on the data signaling and the superimposed pilots.

In an example, a received signal (e.g., measured samples) may be $y = H_D x + \Sigma_i (I_{R*R} \otimes (B \otimes F)) h_i + n$, where x is the data signaling, the superimposed pilots are $h_i$, $H_D$ is (R*REs)x(L*REs) block diagonal matrix, R is a number of reception antennas, L is a number of layers, B and F are basis functions that describe channel variation in time and frequency, respectively, $h_i$ is an (unknown) i-th channel basis function for an i-th superimposed pilots port, $I_{R*R}$ is an identity matrix for R*R, and $\otimes$ is a Kronecker product.

The receiving device may estimate data from the received signaling. For example, the receiving device may perform MMSE data estimation on segments of time and frequency (e.g. 12 resource elements in frequency and 12 symbols in time). An Rnn of noise includes the superimposed pilots and thermal noise, assuming $E[h_i h_i^H] = I\sigma_p^2$ and $E[h_i h_j^H] = 0 \forall j \neq i$ so that the $R\tilde{n}\tilde{n} = [\tilde{n}\tilde{n}^H] = B \otimes F)(B \otimes F)^H \sigma_p^2 + I\sigma_n^2$. The receiving device may assign a probability per constellation point based on a Euclidean distance $$p_c = \frac{\exp(-\|\hat{x} - x_c\|^2/\sigma_{\tilde{n}}^2)}{\sum_c \exp(-\|\hat{x} - x_c\|^2/\sigma_{\tilde{n}}^2)},$$

where $p_c$ is a probability for constellation point c, $\hat{x}$ is the MMSE output, and $x_c$ the constellation point c.

The receiving device may calculate an average $x = \Sigma_c p_c x_c$ and a variance $\Sigma_c p_c \|\hat{x} - x_c\|^2$. The average is used for cancellation, where is $y_{cancel} = y - H_D \bar{x}$. The variance is used for Rnn calculation in a superimposed pilots estimation stage.

After estimating the data from the received signaling, the receiving device may estimate the superimposed pilots. For example, the UE may perform MMSE superimposed pilots estimation, where $Rnn = H_D E[xx^H] H_D^H + I\sigma_n^2$ and a diagonal matrix $\sigma_x^2 = E[xx^H]$ is based on the average and variance from data estimation. The receiving device may cancel the superimposed pilots from the received samples, where $Y_{cancel2} = Y - \Sigma_i (I_{R*R} \otimes (B \otimes F)) \bar{h}_i$.

The receiving device may use the signal having the superimposed pilots canceled to again estimate the data. After again estimating the data, the receiving device may again estimate the superimposed pilots. In this way, the receiving device may iteratively refine the estimates until the data signaling is sufficiently refined for decoding.

For example, as shown in FIG. 6, the UE may receive a signal (e.g., as samples via one or more antennas). The UE may perform an iteration of a data estimation based at least in part the received signal. The UE may subtract an estimation of the data signal from the received signal to isolate the superimposed pilots. The UE may input the received signal having data canceled for performance of superimposed pilots estimation. The UE may also use an estimation of a variance in the average of the data signal to estimate the superimposed pilots. The UE may then subtract an estimate of the superimposed pilots signal from the received signal An output that includes the received signal having the SIP signal canceled (e.g., subtracted) may be provided as input for data estimation in a subsequent iteration of data estimation and superimposed pilots estimation. In some aspects, the UE may perform a configured number of iterations. In some aspects, the UE may continue performing iterations until the data estimation is sufficiently refined for decoding.

As indicated above, FIG. 6 is provided as an example. Other examples may differ from what is described with respect to FIG. 6.

In some examples, a balanced coding scheme may be used to support simplified decoding of a communication and/or to improve error correction of the communication. In some examples, balanced code communications may be used in a network that uses superimposed pilots to improve orthogonality between the balanced code communication and the superimposed pilots.

For example, to reduce receiver complexity (e.g., complexity to receive a communication at the UE), a balanced code communication may use an outer balanced code. In the balanced code, codewords result in vectors of constellation points that sum to a known value (e.g., zero). Therefore, a superimposed pilot channel estimation filter that averages over a codeword will experience orthogonal data. The balanced code length matches time and bandwidth for superimposed pilot coherency such that the codeword matches an averaging filter in time and frequency of the channel superimposed pilot estimation.

An encoding procedure may include mapping $k_b$ bits to $n_b$ bits, where $k_b$ represents the sequence index (e.g., treated as integer), the index is mapped to a balanced codeword of $n_b^q$ symbols of constellation of order q, each symbol is mapped to $\log_2 q$ bits results in $n_b$ bits per codeword, and mapping is done from bit stream to bit stream. A network node may encode the codewords (e.g., a payload of the balanced code communication) using a low-density parity-check (LDPC) code (e.g., an NR code). The network node may map the encoded bits to symbols such that each balanced codeword is mapped to a coherence bandwidth and time that is meant for superimposing one superimposed pilot port. Because the LDPC code is systematic, the balanced codewords remain balanced. The result of this procedure is an LDPC encoded slot where the LDPC systematic parts are balanced and may be used for superimposed pilots while preserving orthogonality to the superimposed pilots.

Balanced code coding may have a code coding rate R<1. Therefore, the balanced code coding results in loss of bandwidth in comparison with not coding the payload. In other words, the balanced code may have a lower code rate as compared to using orthogonal pilots (e.g., as depicted in FIG. 4) and applying coding (such as LDPC coding) to the data and the orthogonal pilots. This may result in loss of bandwidth in comparison with data that is transmitted with the orthogonal pilots.

Some techniques and apparatuses described herein enable a multi-level balanced code for wireless communications. For example, the multi-level balanced code may be associated with encoding data that is transmitted with a SIP. For example, codewords of the multi-level balanced code may be selected based on a finite number of multiple sum values, corresponding to all constellation symbol sequences in the multi-level balanced code. In other words, codewords of the multi-level balanced code may sum to one of the finite number of multiple sum values. The multiple sum values may be selected to mitigate interference with the SIP. In other words, values of the multiple sum values may be a design parameter of the multi-level balanced code. For example, the UE may receive data encoded based on the multi-level balanced code (e.g., the data may be encoded using a codeword associated with a sequence that sums to a value of the multiple sum values). The UE may receive a SIP using communication resources that are occupied by the data (e.g., the SIP and the data may use at least partially overlapping time domain and frequency domain resources). The UE may estimate one or more channel parameters based on the SIP and the multi-level balanced code.

As a result, a code rate may be improved as compared to a balanced code that balances to a single known value. For example, having multiple sum values may provide additional flexibility by selecting the number of the multiple sum values based at least in part on an application and/or channel conditions, among other examples. This may improve throughput and/or bandwidth (e.g., as compared to a balanced code with a single sum value). Additionally, orthogonality is achieved while maintaining improved spectral efficiency compared to orthogonal pilots. Further, the multi-level balanced code may improve error correction capabilities on top of the LDPC, such that overall performance of the communication of the data is improved.

In some aspects, the finite number of the multiple sum values may be less than a threshold relative to a number of codewords in the multi-level balanced code. In some aspects, the multiple sum values may be small values (e.g., less than or equal to a value threshold and/or close to zero) to improve interference mitigation between the SIP and the data. For example, the multi-level balanced code consists of all the sequences over the constellation that sum to the multiple sum values. The codewords may be selected to be part of the code according to the sum of the sequences over the constellation. For example, the multi-level balanced code may be an enumeration of all balanced sequences of a fixed length and given constellation in a lexicographic order. This balanced coding may achieve, by construction, a highest coding rate possible for the multi-level balanced code. The balanced coding may be implemented by translating an index to a sequence or a sequence to an index by "walking" along a path in a trellis diagram. The codebook may include real codewords of a pulse-amplitude modulation (PAM) constellation and every pair of codewords may be used as real and imaginary parts for a block to match a superimposed pilots sequence.

Figure 7:
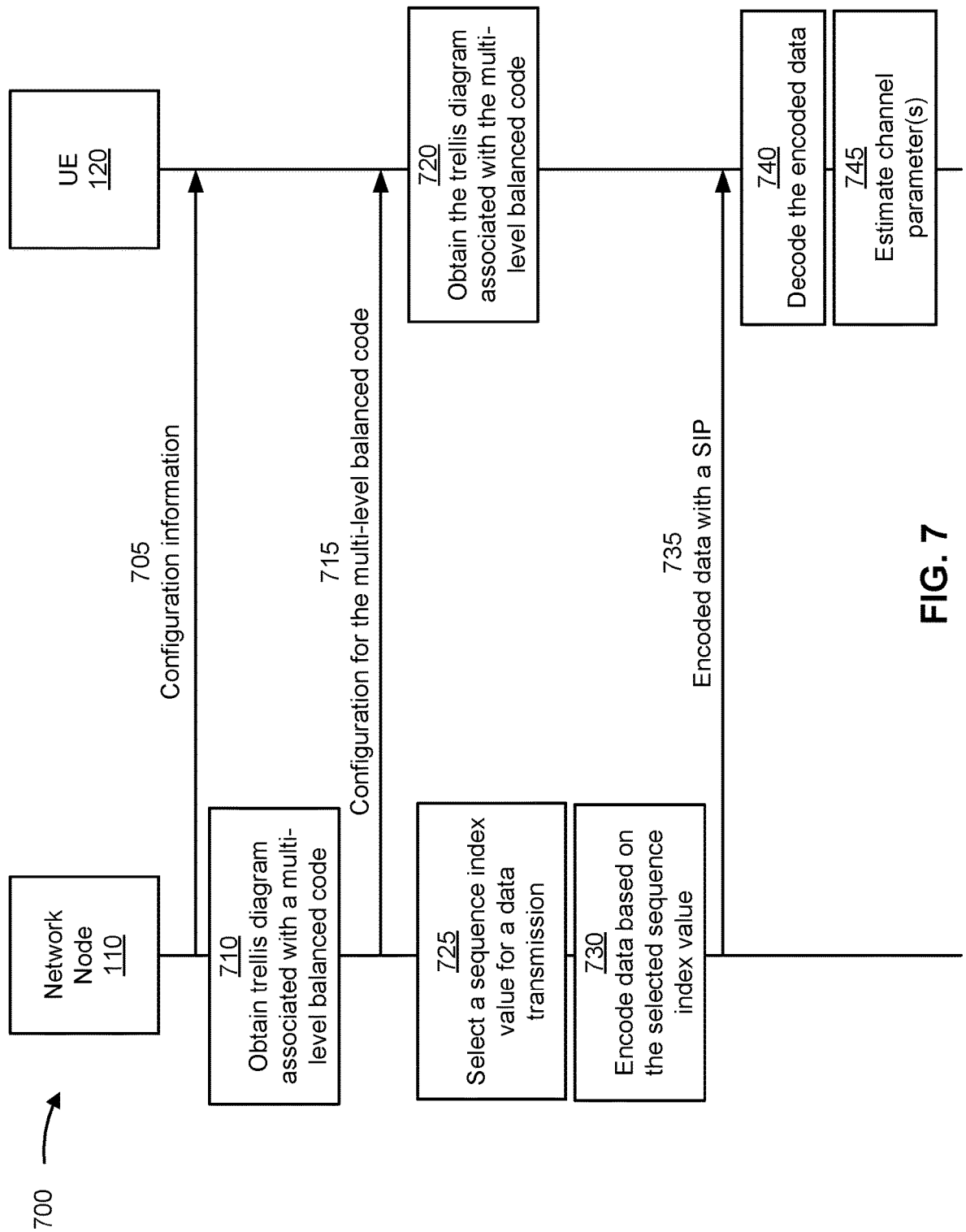
FIG. 7 is a diagram of an example associated with a multi-level balanced code for wireless communications, in accordance with the present disclosure.

FIG. 7 is a diagram of an example 700 associated with a multi-level balanced code for wireless communications, in accordance with the present disclosure. As shown in FIG. 7, a network node 110 (e.g., a base station, a CU, a DU, and/or an RU) may communicate with a UE 120. In some aspects, the network node 110 and the UE 120 may be part of a wireless network (e.g., the wireless network 100). The UE and the network node may have established a wireless connection prior to operations shown in FIG. 7.

In some aspects, actions described herein as being performed by a network node 110 may be performed by multiple different network nodes. For example, configuration actions may be performed by a first network node (for example, a CU or a DU), and radio communication actions may be performed by a second network node (for example, a DU or an RU). As used herein, the network node 110 "transmitting" a communication to the UE 120 may refer to a direct transmission (for example, from the network node 110 to the UE 120) or an indirect transmission via one or more other network nodes or devices. For example, if the network node 110 is a DU, an indirect transmission to the UE 120 may include the DU transmitting a communication to an RU and the RU transmitting the communication to the UE 120. Similarly, the UE 120 "transmitting" a communication to the network node 110 may refer to a direct transmission (for example, from the UE 120 to the network node 110) or an indirect transmission via one or more other network nodes or devices. For example, if the network node 110 is a DU, an indirect transmission to the network node 110 may include the UE 120 transmitting a communication to an RU and the RU transmitting the communication to the DU.

As shown by reference number 705, the network node 110 may transmit, and the UE 120 may receive, configuration information. In some aspects, the UE 120 may receive the configuration information via one or more of system information signaling, RRC signaling, one or more MAC control elements (MAC-CEs), and/or DCI, among other examples. In some aspects, the configuration information may include an indication of one or more configuration parameters (e.g., stored by the UE 120 and/or previously indicated by the network node 110 or other network device) for selection by the UE 120, and/or explicit configuration information for the UE 120 to use to configure itself, among other examples.

In some aspects, the configuration information may indicate that the UE 120 is to provide an indication of support for using the multi-level balanced code communications when in communication with the network node 110. In some aspects, the configuration may indicate one or more parameters of the multi-level balanced code. In some aspects, the configuration information may indicate that the UE 120 is to obtain a trellis diagram associated with the multi-level balanced code. For example, the configuration information may indicate parameters for the UE 120 to generate the trellis diagram. In some aspects, the configuration information may indicate that the UE 120 is to receive the parameters to be used by the UE 120 to generate the trellis diagram in a later communication. In some aspects, the configuration information may indicate that the UE 120 is to receive an indication of a constructed trellis diagram.

For example, the configuration information may indicate one or more multi-level balanced code parameters. The indication of the multi-level balanced code parameters may be included in a configuration of the multi-level balanced code. Additionally, or alternatively, the indication of the multi-level balanced code parameters may be included in a SIP configuration (e.g., a pilot table). The one or more multi-level balanced code parameters may include a size (e.g., a length) of codewords and/or sequences associated with the multi-level balanced code, a constellation, possible sums of sequences associated with the codewords (e.g., an indication of one or more supported values for balancing sequences), how to map the codewords inside a resource block, and/or a trellis diagram associated with the multi-level balanced code, among other examples.

In some aspects, the UE 120 may receive an indication of one or more parameters associated with SIPs. The one or more parameters may include the multiple sum values, a quantity of ports, a span of symbols associated with the SIP, an indication of resource blocks associated with the SIP, a length of the codewords, a constellation type, how to map the codewords inside a resource block, a trellis diagram associated with the multi-level balanced code, a type of pilot port multiplexing (e.g., frequency division multiplexing, time division multiplexing, code division multiplexing, and/or a mixed multiplexing scheme), an indication of an allocated power for transmissions compared to a power associated with the data (e.g., relative allocated power compared to a data power), and/or a beam identifier, among other examples. In other words, the one or more parameters may include the multi-level balanced code parameters and one or more other parameters associated with SIPs.

In some aspects, the configuration information may indicate a mapping between index values and codeworks. The index values may be sequence index values. For example, An encoding procedure may include mapping $k_b$ bits to $n_b$ bits, where $k_b$ represents the sequence index (e.g., treated as integer), the index is mapped to a balanced codeword of $n_b^q$ symbols of constellation of order q, each symbol is mapped to $\log_2 q$ bits results in $n_b$ bits per codeword, and mapping is done from bit stream to bit stream. The network node may encode the codewords (e.g., a payload of the balanced code communication) using an LDPC code (e.g., an NR code). The configuration information may indicate a mapping between the sequence index and codewords.

In some aspects, the UE 120 may transmit, and the network node 110 may receive, a capability report. The capability report may indicate whether the UE 120 supports the multi-level balanced code. In some aspects, the capability report may indicate one or more capabilities of the UE 120 associated with the multi-level balanced code. For example, the capability report may indicate one or more parameters of the multi-level balanced code supported by the UE 120. For example, the one or more capabilities may include an indication of support for the multi-level balanced code, SIPs included in signals, a quantity of supported values for balancing sequences of the codewords, an indication of one or more supported values for balancing the sequences, a quantity of superimposed ports associated with the signals, and/or a length of the sequences, among other examples. For example, in some aspects, the capability report may indicate that the UE 120 supports all parameters of the multi-level balanced code (e.g., with no restrictions). In some aspects, the capability report may indicate that the UE 120 partially supports the multi-level balanced code (e.g., supports the multiple level balanced code with a limitation on one or more parameters, such as the number of superimposed ports, or a number of possible sums, and/or maximal length of codewords, among other examples).

The network node 110 may determine the configuration information based at least in part on the capability report. For example, the network node 110 may configure the UE 120 to use the multi-level balanced code for communications between the UE 120 and the network node 110 based at least in part on the capability report indicating that the UE 120 supports the multi-level balanced code and/or supports parameters to be used for the multi-level balanced code.

The UE 120 may configure itself based at least in part on the configuration information. In some aspects, the UE 120 may be configured to perform one or more operations described herein based at least in part on the configuration information.

As shown by reference number 710, the network node 110 may obtain a trellis diagram associated with the multi-level balanced code communication. In some aspects, the network node 110 may obtain multiple trellis diagrams, with the multiple trellis diagrams associated with different UEs and/or different networks and/or channel conditions for each UE. In some aspects, the network node 110 may construct the trellis diagram based at least in part on one or more parameters indicated from another network node or a node outside of the network. In some aspects, the network node 110 may receive an indication of the trellis diagram from the other network node or the node outside of the network.

The network node 110 may generate the trellis diagram. In some aspects, the network node 110 may generate the trellis diagram in a recursive manner. In some aspects, the network node 110 may generate the trellis diagram based at least in part on one or more parameters, such as multiple possible sum values for sequences of codewords associated with the multi-level balanced code, and/or a constellation associated with the multi-level balanced code, among other examples. For example, for a trellis diagram associated with an M-PAM constellation and a length N, an initialization of the generation of the trellis diagram may include S(N) which may be a design parameter indicating the multiple sum values (such as {−2, 0, 2}), X={−M+1, −M+3, ..., −1, 1, 3, ...,M−3,M−1} indicating possible constellation points of the M-PAM constellation, and M(s, N)=1, s ∈ S(N), where S(k) is a possible partial sum at a stage k of the trellis diagram and M(0,0) indicates the number of codewords associated with the trellis diagram. A process to generate the trellis diagram may include:

For $k = N - 1: -1:0$, $S(k) = \{s : s \in S(k+1) - X)\} \cap s \leq k \cdot (M-1) \cap s \geq k \cdot (-M+1)\}$ For every $S \in S(k)$ $X(s, k) = \{x \in X : s + x \in (k+1), s \in S(k)\}$ $M(s, k) = \sum_{x \in X} M(s + x, k + 1)$ where S(k) is the possible partial sums at a stage k, χ(s, k) is the possible set of constellation points at stage k for the partial sum s ∈ S(k),M(s, k) is the number of proceeding paths at stage k for the partial sum s ∈ S(k), and M(0,0) indicates the number of codewords associated with the trellis diagram.

In other words, to generate the trellis diagram, the network node 110 may identify, for each stage of the trellis diagram, one or more valid partial sums. The network node 110 may identify, for each valid partial sum of the one or more valid partial sums, one or more allowed symbols in a constellation associated with the trellis diagram, where an allowed symbol is a symbol that results in a valid partial sum at a next stage of the trellis diagram when combined with a valid partial sum at a current stage of the trellis diagram. The network node 101 may identify, for each valid partial sum of the one or more valid partial sums, one or more proceeding paths. A proceeding path may be a path leading to a partial sum at the next stage where a difference between the partial sum at the next stage and a partial sum at the current stage is a constellation point in the constellation associated with the trellis diagram. A node in a stage k may include a valid partial sum, from the one or more valid partial sums and the one or more proceeding paths. The node is associated with one or more edges corresponding to allowed symbols, from the one or more allowed symbols, for the valid partial sum.

For example, the parameters that define the multi-level balanced code and the trellis diagram may include the constellation (e.g., M−PAM which includes all the odd negative and positive numbers from—(M−1) to M−1 with ascending order), the sequence length N (e.g., the number of elements in each balanced sequence), and the set of possible sums for sequences (e.g., S(N)). The trellis diagram may (e.g., nodes and edges) together with the number of proceeding paths for each node, the partial sum at each node, and the set of allowed symbols for node may be calculated recursively by the network node 110 starting from the end (e.g., a stage N of the trellis diagram). To start, the number of proceeding paths for each node (e.g., possible sum) at stage N (the final stage) is set to 1. For each stage, starting at stage N−1 to a stage 0, the network node 110 may identify a set of valid partial sums for the current stage. A partial sum may be valid if: 1) the difference between at least one of the possible sums of the next stage and itself (the partial sum) is exactly a constellation point, and 2) the partial sum is within a proper range (e.g., no more the stage number times the maximal constellation point of the constellation and no less than the stage number times the minimal constellation point of the constellation point). For every valid partial sum, the allowed symbol(s) are all the symbols in the constellation where adding the symbol to the partial sum results in a valid sum of the next stage. For every valid partial sum, the number of proceeding paths is the sum of the number of proceeding paths of the next stage the next stage possible sums are resulted from increasing the current partial sum by a constellation point. Each pair of valid partial sum and a number of proceeding paths belong to a node in the trellis diagram and the allowed symbols for each partial sum are the edges connected to that node. An example trellis diagram is depicted and described in more detail in connection with FIG. 8.

As shown by reference number 715, the network node 110 may transmit, and the UE 120 may receive, a configuration for the multi-level balanced code. In some aspects, the configuration for the multi-level balanced code may be included in an RRC communication. Additionally, or alternatively, the configuration for the multi-level balanced code may be included in DCI scheduling a data transmission that will be encoded using the multi-level balanced code. For example, one or more DCI fields may indicate the multi-level balanced code to be used and a pilot pattern for one or more SIPs to be included in the data transmission scheduled by the DCI. In some aspects, a table of possible combinations of pilot patterns and configuration parameters of the multi-level balanced code may be configured via an RRC configuration. The DCI may indicate an entry in the table (e.g., to reduce a size of the DCI field used to indicate the multi-level balanced code to be used and the pilot pattern). In other words, the existence of a SIP, a pilot pattern, and an indication of the multi-level balanced code to be used to encode data may be indicated in a DCI communication that schedules the transmission of the encoded data and the SIP.

As shown by reference number 720, the UE 120 may obtain the trellis diagram associated with the multi-level balanced code. In some aspects, an indication of the trellis diagram may be included in the configuration information (e.g., received by the UE 120 as described above in connection with reference number 705) and/or the configuration for the multi-level balanced code (e.g., received by the UE 120 as described above in connection with reference number 715). In some aspects, the UE 120 may generate the trellis diagram based at least in part on one or more parameters indicated in the configuration information and/or the configuration for the multi-level balanced code. For example, the UE 120 may generate the trellis diagram in a similar (or the same) manner as described above in connection with the network node 110 generating the trellis diagram (e.g., as described in connection with reference number 710).

As shown by reference number 725, the network node 110 may select an index value (e.g., a sequence index value) that corresponds to a payload (e.g., a data payload) to be transmitted to the UE 120. For example, as described elsewhere herein, the network node 110 may store a mapping of index values (e.g., a sequence index values) to payloads (e.g., one or more bits of information). The network node 110 may select an index value that corresponds to data to be transmitted to the UE 120.

As shown by reference number 730, the network node 110 may encode the data using the multi-level balanced code and the selected sequence index value. For example, the network node 110 may identify a sequence of a codeword (e.g., that sums to one of the selected finite number of multiple sum values of the multi-level balanced code) to be transmitted to the UE 120 using the selected sequence index value and the multi-level balanced code (e.g., using the obtained trellis diagram). For example, the process for encoding the data may include inputting an index I and outputting a codeword d. The process may include setting I'=I, and D=0, and:

For $k = 1:N$ $s = \max_{c \in X}$ $\left\{ \sum_{x \in X(D,k), x<c} M(D+x, k) \,\middle|\, I' \geq \sum_{x \in X(D,k), x<c} M(D+x, k) \right\}$ $d(k) = \operatorname{argmax}_{c \in X}$ $\left\{ \sum_{x \in X(D,k), x<c} M(D+x, k) \,\middle|\, I' \geq \sum_{x \in X(D,k), x<c} M(D+x, k) \right\}$ $D = D + d(k)$ $I' = I - s$ where M(D,k) is the number of proceeding paths from a partial sum D at a stage k, and $\chi(D, k)$ is a set of allowed constellation symbols from the partial sum D at the stage k.

In other words, to encode the data, the network node 110 may identify the index value associated with a codeword of the multi-level balanced code. The network node 110 may identify, at each stage of the trellis diagram associated with the multi-level balanced code, a sequence value to be included in a sequence of the codeword based on the index value. For example, identifying the sequence value may include the network node 110 setting a value of a counter to the index value. The network node 110 may calculate cumulative sums of proceeding paths for each node in a current stage of the trellis diagram. The network node 110 may calculate a first cumulative sum, from the cumulative sums, that is less than the value of the counter and is closest to the value of the counter. The network node 110 may identify that the sequence value is a value of a node, from each node in the current stage, associated with the first cumulative sum. The network node 110 may update the value of the counter to an updated value by subtracting the first cumulative sum. The network node 110 may continue to the next stage of the trellis diagram to determine a next sequence value for the sequence of the codeword in a similar manner as described above. For example, the network node 110 may calculate cumulative sums of proceeding paths for each node in a next stage of the trellis diagram. The network node 110 may identify a second cumulative sum, from the cumulative sums associated with the next stage, that is less than the updated value of the counter and is closest to the updated value of the counter. The network node 110 may identify that the next sequence value is a value of a node, from each node in the next stage, associated with the second cumulative sum. The network node 110 may update the updated value of the counter by subtracting the second cumulative sum. The network node 110 may proceed in a similar manner through each stage of the trellis diagram to identify values of the sequence of the codeword.

For example, the encoding process for the multi-level balanced code may include setting a counter to the index value that is mapped to the codeword to be transmitted. At each stage of the trellis diagram, the encoding procedure may include calculating ranges for the current stage as the cumulative sums of the proceeding paths in the nodes connected to each respective node (ordered according to the constellation order)—first is the number of proceeding paths from the node connected by the first allowed symbol, the second is the sum of the first and the second allowed symbols, the third is the sum of the first three allowed symbols, and so on. The encoding procedure may include identifying an element of the cumulative sums which is closest to the value of the counter (e.g., from cumulative sums that are less than the value of the counter). The encoding procedure may include outputting to the sequence the symbol that matches the selected cumulative sum as indicted by the trellis diagram. The encoding procedure may include updating the counter by subtracting the value of the selected cumulative sum. The sequence may be calculated element by element so that at the end of the process the counter reaches zero and sequence sum is one of the multiple possible sums that are selected for the multi-level balanced code.

In some aspects, in addition to encoding data using the multi-level balanced code (as described above), the network node 110 may encode the data using an additional network coding scheme. For example, the multi-level balanced code may include mapping bits to constellation symbols (e.g., as indicated by the sequence of the codeword). The constellation symbols may be mapped to bits of information. The mapped bits may be encoded using a network coding scheme, such as LDPC coding. The network node 110 may transmit the encoded bits to the UE 120 (e.g., as described in more detail below).

As shown by reference number 735, the network node 110 may transmit, and the UE 120 may receive, data encoded based on the multi-level balanced code. Additionally, the network node 110 may transmit, and the UE 120 may receive, a SIP using communication resources occupied by the data. For example, the data encoded based on the multi-level balanced code may include the sequence of the codeword as encoded by the network node 110 (e.g., as described above in connection with reference number 730).

As shown by reference number 740, the UE 120 may decode the data that is encoded based on the multi-level balanced code. For example, the UE 120 may apply a network coding scheme to decode bits received from the network node 110 to obtain a sequence of a codeword transmitted to the UE 120. The UE 120 may decode the data encoded based on the multi-level balanced code using the trellis diagram associated with the multi-level balanced code. For example, the decoding procedure may include obtaining an index value I (e.g., a sequence index value or a codeword index value) from a codeword d that is received by the UE 120. For example, the decoding procedure may include setting I'=0 and D=0. The decoding procedure may include:

For $k = 1:N$ $D = D + d(k)$ $s = \sum_{x \in X(D,k), x<c} M(D+x, k)$ $I' = I' + s$ Finalize: $I = I'$ For example, the UE 120 may identify a codeword associated with the multi-level balanced code, where the codeword is associated with a sequence. The UE 120 may calculate an index value associated with the codeword based at least in part on aggregating, for each stage of the trellis diagram, sums of proceeding paths connected to a symbol associated with respective elements in the sequence (e.g., the index value being mapped to the data). For example, the UE 120 may calculate, at each stage of the trellis diagram, a sum of proceeding paths for all nodes in the trellis diagram that are connected to allowed symbols that are prior to a node associated with a sequence element of the sequence. The UE 120 may update a counter associated with calculating the index value with the sum of the proceeding paths.

In other words, the decoding procedure may include setting a counter to a value of zero (0). At each stage, an element of the sequence of the codeword may be input to a decoder of the UE 120. Given a sequence element for a current stage of the trellis diagram, the UE 120 may calculate the sum of the proceeding paths of all nodes connected to the allowed symbols that are prior to the sequence element. The UE 120 may update the counter by adding the calculated sum to the value of the counter. At the end of the decoding procedure (e.g., after each sequence element is input to the decoder) the value of counter will be the index value of the sequence.

The UE 120 may identify the data based at least in part on the index value. For example, the UE 120 may store and/or receive an indication of a mapping between index values and data bits. The UE 120 may obtain the data bits based at least in part on the calculated index value of the codeword received from the UE 120.

As shown by reference number 745, the UE 120 may estimate one or more channel parameters based on the SIP and the multi-level balanced code. For example, the UE may estimate one or more parameters of communicating with the network node based at least in part on the configuration and based at least in part on applying balancing as a property of the balanced code communication. In some aspects, estimating the one or more parameters of communicating with the network node 110 may include estimating a channel for communication between the network node 110 and the UE 120 or performing beam management, among other examples. For example, the UE 120 may extract the SIP from the data and estimate the one or more parameters using the extracted SIP (e.g., in a similar manner as described above in connection with FIG. 6).

By using the multi-level balanced code to encode the data, interference between the SIP and the data may be reduced. Additionally, by using multiple sum values, corresponding to all constellation symbol sequences in the multi-level balanced code, a code rate of the multi-level balanced code may be increased. For example, having multiple sum values may provide additional flexibility by selecting the number of the multiple sum values based at least in part on an application and/or channel conditions, among other examples. Increasing the code rate may improve throughput and/or bandwidth (e.g., as compared to a balanced code with a single sum value). Additionally, orthogonality may be achieved while maintaining improved spectral efficiency compared to orthogonal pilots. Further, the multi-level balanced code may improve error correction capabilities on top of the LDPC, such that overall performance of the communication of the data is improved.

As indicated above, FIG. 7 is provided as an example. Other examples may differ from what is described with respect to FIG. 7.

Figure 8:
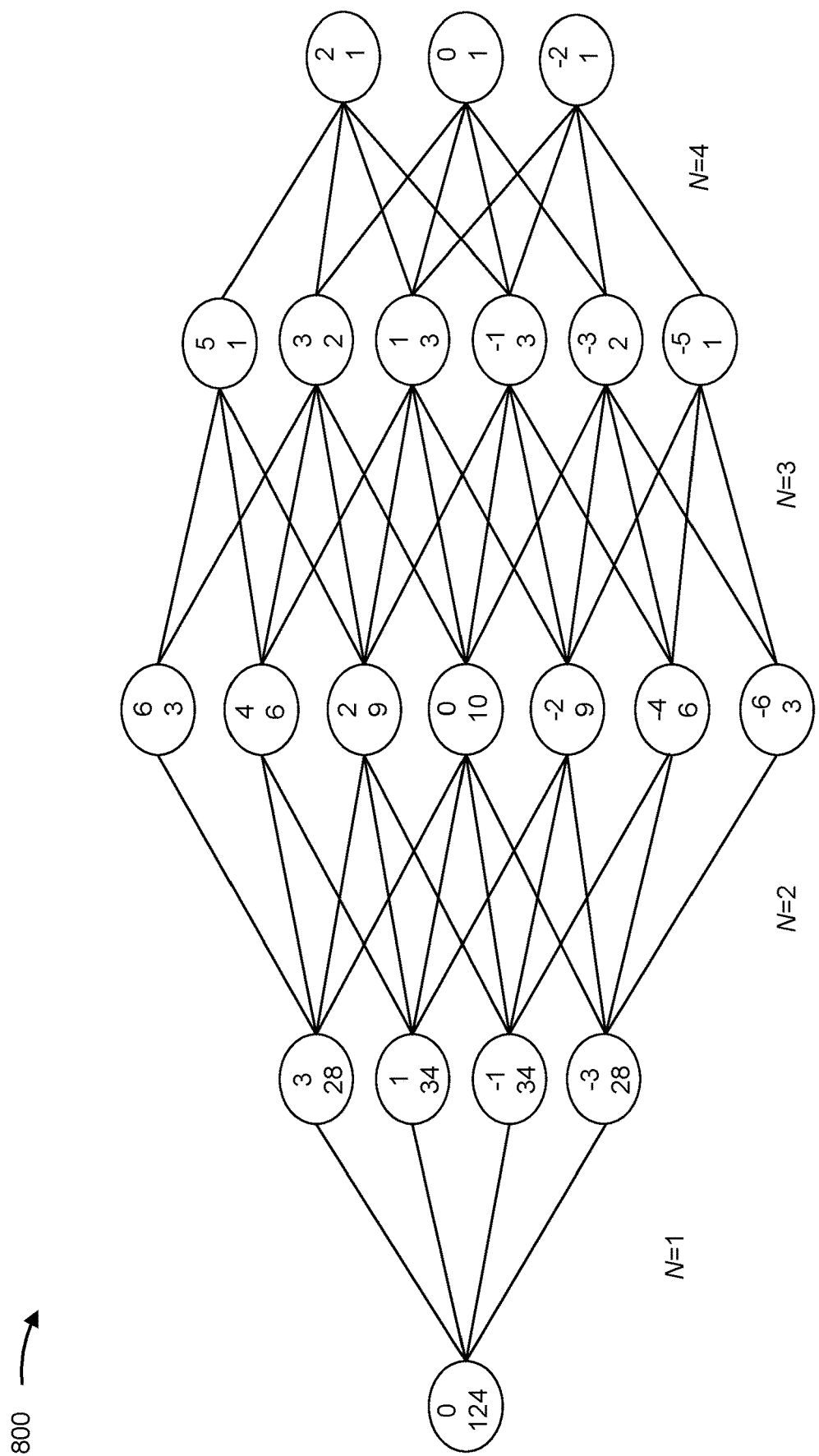
FIG. 8 is a diagram of an example trellis diagram associated with a multi-level balanced code, in accordance with the present disclosure.

FIG. 8 is a diagram of an example trellis diagram 800 associated with a multi-level balanced code, in accordance with the present disclosure. The trellis diagram depicted in FIG. 8 is associated with a length (size) of N=4 and a constellation of 4-PAM. The trellis diagram depicted in FIG. 8 is associated with multiple possible sums of sequence values of {2, 0, and −2}. For example, the multiple sum values include zero and one or more other values. The values of the multiple sums may be low values (e.g., close to zero) to mitigate interference between data and one or more SIPs in a transmission, as described in more detail elsewhere herein. The example trellis diagram 800 is depicted for illustration and simplicity. Other trellis diagrams used for the multi-level balanced code may have different lengths, different constellations, different values for the multiple possible sums, and/or more or less possible sums, among other examples.

As shown in FIG. 8, the trellis diagram may include multiple nodes at each stage of the trellis diagram (e.g., a stage is a vertical column of nodes as depicted in FIG. 8). A last stage (e.g., shown at the right hand side of the trellis diagram) includes nodes corresponding to the multiple possible sums of sequence values of {2, 0, and −2}. Other nodes in the trellis diagram may correspond to partial sums (e.g., shown as the upper number within each node) and a number of possible proceeding paths from the node (e.g., shown as the lower number within each node). Each node may be associated with one or more edges (e.g., shown as lines extending from a given node going from left to right along the trellis diagram). The edges (e.g., the lines) may correspond to a constellation point in the constellation (e.g., 3, 1, −1, or −3 in the example of a 4-PAM constellation).

The example trellis diagram 800 may be associated with 124 possible codewords (e.g., 124 possible valid paths). For example, the example trellis diagram 800 may be associated with a code rate of $$\frac{\lfloor \log_2 124 \rfloor}{4 \cdot \log_2 4} = \frac{6}{8}.$$

Therefore, by increasing the number of possible sums (e.g., to include multiple possible sums), the number of codewords may by increased, thereby increasing the code rate of the multi-level balanced code.

As an example, an encoder (e.g., deployed by the network node 110) may obtain a sequence of a codeword for a given index value by "walking along" the trellis diagram. For example, the index value may be 84. The encoder may set a counter to 84 based on the index value. At a first stage (N=1), the encoder may determine a node (and corresponding sequence value) based on the index value. For example, at the first stage, the cumulative sums of the proceeding paths may be 28, 62 (28+34), 96 (28+34+34), and 124 (28+34+34+28). The encoder may determine that the value of the counter (84) is greater than 62 and less than 96. Therefore, the node corresponding to the cumulative sum of 96 may be selected for the first stage (e.g., because the index value is between 62 and 96). In other words, the node associated with a partial sum of 1 may be selected at the first stage. The encoder may update a value of the counter to 22 (e.g., 84-62) and proceed to the second stage (N=2). Because the first stage is associated with a first sequence value, the partial sum may be the sequence value. In other words, a first sequence value of the sequence of the codeword may be 1.

The cumulative sums at the second stage may be based at least in part on the paths proceeding from the node selected at the first stage (e.g., the node having the partial sum of 1). For example, the cumulative sums at the second stage may be 9, 19 (9+10), 28 (9+10+9), and 34 (9+10+9+6). The encoder may identify that the current value of the counter (e.g., 22) is between 19 and 28. Therefore, the node corresponding to the cumulative sum of 28 (e.g., the node with a partial sum of 2) may be selected for the second stage (e.g., because the counter has a value between 19 and 28). The encoder may update a value of the counter to 3 (e.g., 22−19) and proceed to the third stage (N=3). Because the partial sum at the second stage is calculated as 2, the encoder may identify that the second sequence value of the sequence is 1 (e.g., 1+1=2, the partial sum at the second stage) based on the first sequence value being 1.

The cumulative sums at the third stage may be based at least in part on the paths proceeding from the node selected at the second stage (e.g., the node having the partial sum of 2). For example, the cumulative sums at the second stage may be 3, 6 (3+3), 8 (3+3+2), and 9 (3+3+2+1). The encoder may identify that the current value of the counter (e.g., 3) is between 3 and 6. Therefore, the node corresponding to the cumulative sum of 6 (e.g., the node with a partial sum of 1) may be selected for the third stage (e.g., because the counter has a value between 3 and 6). The encoder may update a value of the counter to 9 (e.g., 3−3) and proceed to the fourth stage (N=4). Because the partial sum at the second stage is calculated as 1, the encoder may identify that the third sequence value of the sequence is −1 (e.g., 2+−1=1, the partial sum at the third stage) based on the first sequence value being 1 and the second sequence value being 1.

The cumulative sums at the fourth stage may be based at least in part on the paths proceeding from the node selected at the second stage (e.g., the node having the partial sum of 1). For example, the cumulative sums at the second stage may be 1, 2 (1+1), and 3 (1+1+1). The encoder may identify that the current value of the counter (e.g., 0) is between 0 and 1. Therefore, the node corresponding to the cumulative sum of 1 (e.g., the node with a partial sum of −2) may be selected for the fourth stage (e.g., because the counter has a value between 0 and 1). Because the partial sum at the second stage is calculated as −2, the encoder may identify that the fourth sequence value of the sequence is −3 (e.g., 1+−3=−2, the partial sum at the fourth stage) based on the first sequence value being 1, the second sequence value being 1, and the third sequence value being −1. Because the fourth stage is the final stage, the output sequence value for the index value of 84 may be $(1,1, -1, -3)^T$. The codeword may be transmitted to the UE 120 (e.g., after being mapped to bits via LDPC coding or another network coding scheme).

A decoder (e.g., at the UE 120) may receive the sequence of the codeword as $(1, 1, -1, -3)^T$. The decoder may calculate the index value corresponding to the codeword by walking through the trellis diagram and identifying nodes corresponding to the partial sum of the sequence at each stage. For example, at a first stage, the decoder may calculate that the partial sum is 1. Therefore, the node corresponding to the partial sum of 1 may be selected. A counter may be updating by adding the number of proceeding paths of all nodes in the first stage below the selected node (e.g., 28+34=62). At the second stage, the decoder may calculate that the partial sum is 2 (e.g., 1+1). Therefore the node corresponding to the partial sum of 2 in the second stage may be selected. The decoder may update the counter by adding the number of proceeding paths associated valid nodes connected to the selected node from the first stage that are below the selected node in the second stage. For example, the counter may be updated to a value of 81 (e.g., the cumulative sum of proceeding paths for nodes below the node selected in the second stage may be 19 (9+10) and 62+19=81).

The decoder may calculate that the partial sum at the third stage is 1 (e.g., 1+1+−1). Therefore, the node connected to the node selected at the second stage that corresponds to the partial sum of 1 may be selected at the third stage. The decoder may update the counter by adding the number of proceeding paths associated valid nodes connected to the selected node from the second stage that are below the selected node in the third stage. For example, the counter may be updated to a value of 84 (e.g., the cumulative sum of proceeding paths for nodes below the node selected in the second stage may be 3 and 81+3=84). The decoder may calculate that the partial sum at the third stage is −2 (e.g., 1+1+−1+−3). Therefore, the node connected to the node selected at the second stage that corresponds to the partial sum of −2 may be selected at the third stage. Because there are no valid nodes below the selected node in the fourth stage, the counter may not be updated (or a value of zero may be added to the value of the counter). Therefore, because the fourth stage is the final stage, the decoder may calculate that the index value corresponding to the codeword is 84 (e.g., the current value of the counter). The decoder may identify data (e.g., one or more bits) that is mapped to the index value of 84.

As shown in FIG. 8, by including multiple possible sums for sequences of codewords associated with the multi-level balanced code, a number of possible codewords may be increased and/or a flexibility for coding may be improved. This may increase a code rate of the multi-level balanced code. For example, simultaneous coding rate gain and interference mitigation between data and SIPS may be achieved using the multi-level balanced code.

As indicated above, FIG. 8 is provided as an example. Other examples may differ from what is described with respect to FIG. 8.

Figure 9:
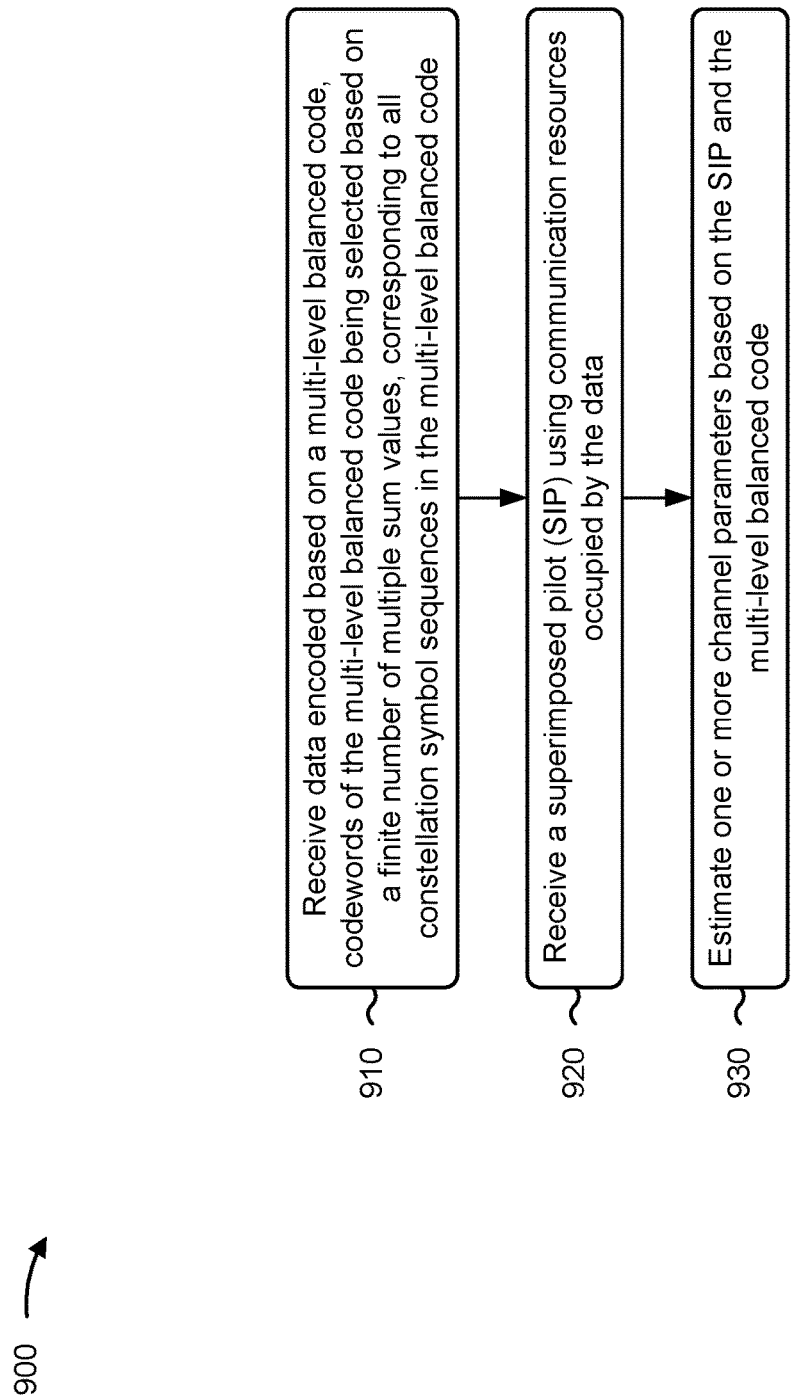
FIG. 9 is a diagram illustrating an example process performed, for example, by a UE, in accordance with the present disclosure.

FIG. 9 is a diagram illustrating an example process 900 performed, for example, by a UE, in accordance with the present disclosure. Example process 900 is an example where the UE (e.g., UE 120) performs operations associated with multi-level balanced code for wireless communications.

As shown in FIG. 9, in some aspects, process 900 may include receiving data encoded based on a multi-level balanced code, codewords of the multi-level balanced code being selected based on a finite number of multiple sum values, corresponding to all constellation symbol sequences in the multi-level balanced code (block 910). For example, the UE (e.g., using communication manager 140 and/or reception component 1102, depicted in FIG. 11) may receive data encoded based on a multi-level balanced code, codewords of the multi-level balanced code being selected based on a finite number of multiple sum values, corresponding to all constellation symbol sequences in the multi-level balanced code, as described above in connection with FIGS. 7-8.

As further shown in FIG. 9, in some aspects, process 900 may include receiving a SIP using communication resources occupied by the data (block 920). For example, the UE (e.g., using communication manager 140 and/or reception component 1102, depicted in FIG. 11) may receive a SIP using communication resources occupied by the data, as described above in connection with FIGS. 7-8.

As further shown in FIG. 9, in some aspects, process 900 may include estimating one or more channel parameters based on the SIP and the multi-level balanced code (block 930). For example, the UE (e.g., using communication manager 140 and/or channel estimation component 1108, depicted in FIG. 11) may estimate one or more channel parameters based on the SIP and the multi-level balanced code, as described above in connection with FIGS. 7-8.

Process 900 may include additional aspects, such as any single aspect or any combination of aspects described below and/or in connection with one or more other processes described elsewhere herein.

In a first aspect, the finite number is less than a threshold relative to a number of codewords in the multi-level balanced code.

In a second aspect, alone or in combination with the first aspect, process 900 includes decoding the data encoded based on the multi-level balanced code using a trellis diagram associated with the multi-level balanced code, and decoding the data includes identifying a codeword associated with the multi-level balanced code, where the codeword is associated with a sequence, and calculating an index value associated with the codeword based at least in part on aggregating, for each stage of the trellis diagram, sums of proceeding paths connected to a symbol associated with respective elements in the sequence, where the index value is mapped to the data.

In a third aspect, alone or in combination with one or more of the first and second aspects, calculating the index value includes calculating, at each stage of the trellis diagram, a sum of proceeding paths for all nodes in the trellis diagram that are connected to allowed symbols that are prior to a node associated with a sequence element of the sequence, and updating a counter associated with calculating the index value with the sum of the proceeding paths.

In a fourth aspect, alone or in combination with one or more of the first through third aspects, process 900 includes receiving an indication of one or more configuration parameters associated with the SIP.

In a fifth aspect, alone or in combination with one or more of the first through fourth aspects, process 900 includes transmitting a capability report indicating one or more capabilities of the UE associated with the multi-level balanced code.

In a sixth aspect, alone or in combination with one or more of the first through fifth aspects, the one or more capabilities include an indication of support for at least one of the multi-level balanced code, SIPs included in signals, a quantity of supported values for balancing sequences of the codewords, an indication of one or more supported values for balancing the sequences, a quantity of superimposed ports associated with the signals, or a length of the sequences.

In a seventh aspect, alone or in combination with one or more of the first through sixth aspects, process 900 includes receiving an indication of one or more parameters associated with the SIP, where the one or more parameters include at least one of the multiple sum values, a quantity of ports, a span of symbols associated with the SIP, an indication of resource blocks associated with the SIP, a length of the codewords, a constellation type, mapping of the codewords inside a resource block, a trellis diagram associated with the multi-level balanced code, a type of pilot port multiplexing, an indication of an allocated power for transmissions compared to a power associated with the data, or a beam identifier.

In an eighth aspect, alone or in combination with one or more of the first through seventh aspects, process 900 includes receiving downlink control information scheduling a communication that includes the data, where the downlink control information indicates the multi-level balanced code and a pilot pattern associated with the SIP.

In a ninth aspect, alone or in combination with one or more of the first through eighth aspects, a sequence of a codeword of the data includes values of the sequence that sum to a value included in the multiple sum values.

In a tenth aspect, alone or in combination with one or more of the first through ninth aspects, the multiple sum values include zero and one or more other values.

In an eleventh aspect, alone or in combination with one or more of the first through tenth aspects, receiving the data includes obtaining a trellis diagram associated with the multi-level balanced code based at least in part on one or more parameters.

In a twelfth aspect, alone or in combination with one or more of the first through eleventh aspects, the one or more parameters include at least one of a constellation associated with the multi-level balanced code, a sequence length associated with the codewords, or the multiple sum values.

In a thirteenth aspect, alone or in combination with one or more of the first through twelfth aspects, obtaining the trellis diagram includes identifying, for each stage of the trellis diagram, one or more valid partial sums, identifying, for each valid partial sum of the one or more valid partial sums, one or more allowed symbols in a constellation associated with the trellis diagram, where an allowed symbol is a symbol that results in a valid partial sum at a next stage of the trellis diagram when combined with a valid partial sum at a current stage of the trellis diagram, and identifying, for each valid partial sum of the one or more valid partial sums, one or more proceeding paths, where a proceeding path is a path leading to a partial sum at the next stage where a difference between the partial sum at the next stage and a partial sum at the current stage is a constellation point in the constellation, where a node in the current stage includes a valid partial sum, from the one or more valid partial sums and the one or more proceeding paths, and the node is associated with one or more edges corresponding to allowed symbols, from the one or more allowed symbols, for the valid partial sum.

In a fourteenth aspect, alone or in combination with one or more of the first through thirteenth aspects, the one or more valid partial sums include partial sums where a difference between the partial sums and at least one partial sum of the next stage of the trellis diagram is equal to one of one or more constellation points in the constellation, and the partial sums are less than a current stage number multiplied by a highest value constellation point in the constellation and not less than the current stage number multiplied by a lowest value constellation point in the constellation.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
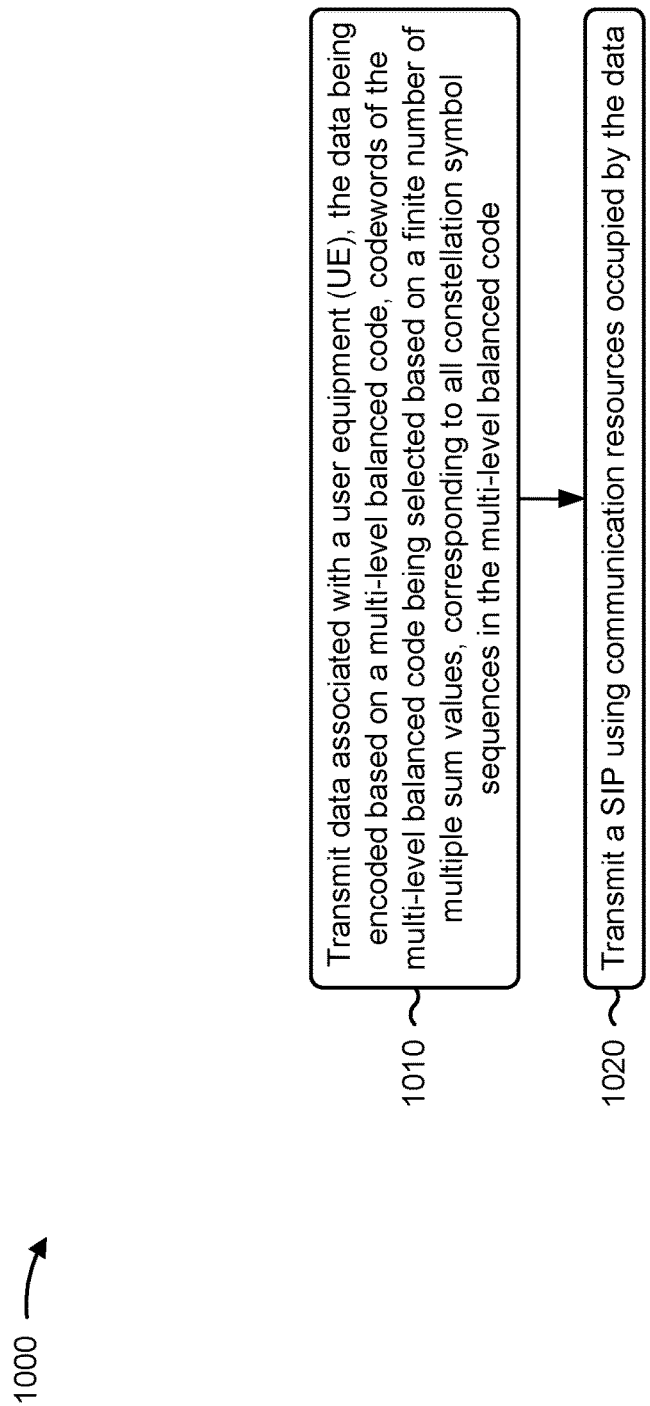
FIG. 10 is a diagram illustrating an example process performed, for example, by a network node, in accordance with the present disclosure.

FIG. 10 is a diagram illustrating an example process 1000 performed, for example, by a network node, in accordance with the present disclosure. Example process 1000 is an example where the network node (e.g., the network node 110) performs operations associated with multi-level balanced code for wireless communications.

As shown in FIG. 10, in some aspects, process 1000 may include transmitting data associated with a UE, the data being encoded based on a multi-level balanced code, and codewords of the multi-level balanced code being selected based on a finite number of multiple sum values, corresponding to all constellation symbol sequences in the multi-level balanced code (block 1010). For example, the network node (e.g., using communication manager 150 and/or transmission component 1204, depicted in FIG. 12) may transmit data associated with a UE, the data being encoded based on a multi-level balanced code, and codewords of the multi-level balanced code being selected based on a finite number of multiple sum values, corresponding to all constellation symbol sequences in the multi-level balanced code, as described above in connection with FIGS. 7-8.

As further shown in FIG. 10, in some aspects, process 1000 may include transmitting a SIP using communication resources occupied by the data (block 1020). For example, the network node (e.g., using communication manager 150 and/or transmission component 1204, depicted in FIG. 12) may transmit a SIP using communication resources occupied by the data, as described above in connection with FIGS. 7-8.

Process 1000 may include additional aspects, such as any single aspect or any combination of aspects described below and/or in connection with one or more other processes described elsewhere herein.

In a first aspect, the finite number is less than a threshold relative to a number of codewords in the multi-level balanced code.

In a second aspect, alone or in combination with the first aspect, process 1000 includes encoding the data encoded based on the multi-level balanced code using a trellis diagram associated with the multi-level balanced code, and encoding the data includes identifying an index value associated with a codeword of the multi-level balanced code, and identifying, at each stage of a trellis diagram associated with the multi-level balanced code, a sequence value to be included in a sequence of the codeword based on the index value.

In a third aspect, alone or in combination with one or more of the first and second aspects, identifying the sequence value to be included in the sequence of the codeword includes setting a value of a counter to the index value, calculating cumulative sums of proceeding paths for each node in a current stage of the trellis diagram, calculating a first cumulative sum, from the cumulative sums, that is less than the value of the counter and is closest to the value of the counter, identifying that the sequence value is a value of a node, from each node in the current stage, associated with the first cumulative sum, and updating the value of the counter to an updated value by subtracting the first cumulative sum.

In a fourth aspect, alone or in combination with one or more of the first through third aspects, encoding the data includes identifying a next sequence value to be included in the sequence of the codeword based on calculating cumulative sums of proceeding paths for each node in a next stage of the trellis diagram, identifying a second cumulative sum, from the cumulative sums associated with the next stage, that is less than the updated value of the counter and is closest to the updated value of the counter, identifying that the next sequence value is a value of a node, from each node in the next stage, associated with the second cumulative sum, and updating the updated value of the counter by subtracting the second cumulative sum.

In a fifth aspect, alone or in combination with one or more of the first through fourth aspects, process 1000 includes transmitting an indication of one or more configuration parameters associated with the SIP.

In a sixth aspect, alone or in combination with one or more of the first through fifth aspects, process 1000 includes receiving a capability report indicating one or more capabilities of the UE associated with the multi-level balanced code.

In a seventh aspect, alone or in combination with one or more of the first through sixth aspects, the one or more capabilities include an indication of support for at least one of the multi-level balanced code, SIPs included in signals, a quantity of supported values for balancing sequences of the codewords, an indication of one or more supported values for balancing the sequences, a quantity of superimposed ports associated with the signals, or a length of the sequences.

In an eighth aspect, alone or in combination with one or more of the first through seventh aspects, process 1000 includes transmitting an indication of one or more parameters associated with the SIP, where the one or more parameters include at least one of the multiple sum values, a quantity of ports, a span of symbols associated with the SIP, an indication of resource blocks associated with the SIP, a length of the codewords, a constellation type, how to map the codewords inside a resource block, a trellis diagram associated with the multi-level balanced code, a type of pilot port multiplexing, an indication of an allocated power for transmissions compared to a power associated with the data, or a beam identifier.

In a ninth aspect, alone or in combination with one or more of the first through eighth aspects, process 1000 includes transmitting downlink control information scheduling a communication that includes the data, where the downlink control information indicates the multi-level balanced code and a pilot pattern associated with the SIP.

In a tenth aspect, alone or in combination with one or more of the first through ninth aspects, a sequence of a codeword of the data includes values of the sequence that sum to a value included in the multiple sum values.

In an eleventh aspect, alone or in combination with one or more of the first through tenth aspects, the multiple sum values include zero and one or more other values.

In a twelfth aspect, alone or in combination with one or more of the first through eleventh aspects, transmitting the data includes obtaining a trellis diagram associated with the multi-level balanced code based at least in part on one or more parameters.

In a thirteenth aspect, alone or in combination with one or more of the first through twelfth aspects, the one or more parameters include at least one of a constellation associated with the multi-level balanced code, a sequence length associated with the codewords, or the multiple sum values.

In a fourteenth aspect, alone or in combination with one or more of the first through thirteenth aspects, obtaining the trellis diagram includes identifying, for each stage of the trellis diagram, one or more valid partial sums, identifying, for each valid partial sum of the one or more valid partial sums, one or more allowed symbols in a constellation associated with the trellis diagram, where an allowed symbol is a symbol that results in a valid partial sum at a next stage of the trellis diagram when combined with a valid partial sum at a current stage of the trellis diagram, and identifying, for each valid partial sum of the one or more valid partial sums, one or more proceeding paths, where a proceeding path is a path leading to a partial sum at the next stage where a difference between the partial sum at the next stage and a partial sum at the current stage is a constellation point in the constellation, where a node in the current stage includes a valid partial sum, from the one or more valid partial sums and the one or more proceeding paths, and the node is associated with one or more edges corresponding to allowed symbols, from the one or more allowed symbols, for the valid partial sum.

In a fifteenth aspect, alone or in combination with one or more of the first through fourteenth aspects, the one or more valid partial sums include partial sums where a difference between the partial sums and at least one partial sum of the next stage of the trellis diagram is equal to one of one or more constellation points in the constellation, and the partial sums are less than a current stage number multiplied by a highest value constellation point in the constellation and not less than the current stage number multiplied by a lowest value constellation point in the constellation.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
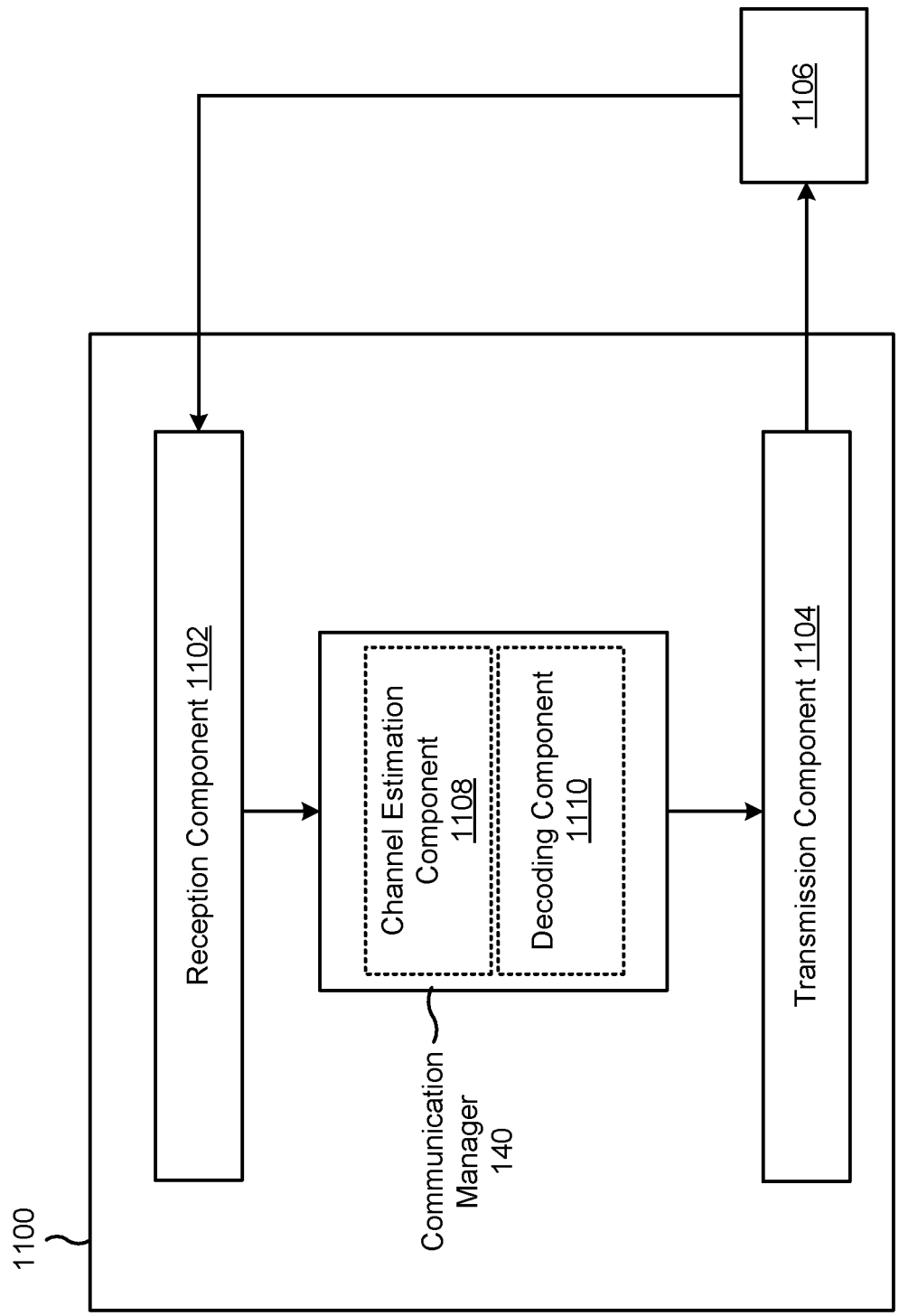
FIG. 11 is a diagram of an example apparatus for wireless communication, in accordance with the present disclosure.

FIG. 11 is a diagram of an example apparatus 1100 for wireless communication, in accordance with the present disclosure. The apparatus 1100 may be a UE, or a UE may include the apparatus 1100. In some aspects, the apparatus 1100 includes a reception component 1102 and a transmission component 1104, which may be in communication with one another (for example, via one or more buses and/or one or more other components). As shown, the apparatus 1100 may communicate with another apparatus 1106 (such as a UE, a base station, or another wireless communication device) using the reception component 1102 and the transmission component 1104. As further shown, the apparatus 1100 may include the communication manager 140. The communication manager 140 may include one or more of a channel estimation component 1108, and/or a decoding component 1110, among other examples.

In some aspects, the apparatus 1100 may be configured to perform one or more operations described herein in connection with FIGS. 7-8. Additionally, or alternatively, the apparatus 1100 may be configured to perform one or more processes described herein, such as process 900 of FIG. 9, or a combination thereof. In some aspects, the apparatus 1100 and/or one or more components shown in FIG. 11 may include one or more components of the UE described in connection with FIG. 2. Additionally, or alternatively, one or more components shown in FIG. 11 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1102 may receive communications, such as reference signals, control information, data communications, or a combination thereof, from the apparatus 1106. The reception component 1102 may provide received communications to one or more other components of the apparatus 1100. In some aspects, the reception component 1102 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1100. In some aspects, the reception component 1102 may include one or more antennas, a modem, a demodulator, a MIMO detector, a receive processor, a controller/processor, a memory, or a combination thereof, of the UE described in connection with FIG. 2.

The transmission component 1104 may transmit communications, such as reference signals, control information, data communications, or a combination thereof, to the apparatus 1106. In some aspects, one or more other components of the apparatus 1100 may generate communications and may provide the generated communications to the transmission component 1104 for transmission to the apparatus 1106. In some aspects, the transmission component 1104 may perform signal processing on the generated communications (such as filtering, amplification, modulation, digital-to-analog conversion, multiplexing, interleaving, mapping, or encoding, among other examples), and may transmit the processed signals to the apparatus 1106. In some aspects, the transmission component 1104 may include one or more antennas, a modem, a modulator, a transmit MIMO processor, a transmit processor, a controller/processor, a memory, or a combination thereof, of the UE described in connection with FIG. 2. In some aspects, the transmission component 1104 may be co-located with the reception component 1102 in a transceiver.

The reception component 1102 may receive data encoded based on a multi-level balanced code, codewords of the multi-level balanced code being selected based on a finite number of multiple sum values, corresponding to all constellation symbol sequences in the multi-level balanced code. The reception component 1102 may receive a SIP using communication resources occupied by the data. The channel estimation component 1108 may estimate one or more channel parameters based on the SIP and the multi-level balanced code.

The decoding component 1110 may decode the data encoded based on the multi-level balanced code using a trellis diagram associated with the multi-level balanced code, wherein decoding the data includes identifying a codeword associated with the multi-level balanced code, wherein the codeword is associated with a sequence; and calculating an index value associated with the codeword based at least in part on aggregating, for each stage of the trellis diagram, sums of proceeding paths connected to a symbol associated with respective elements in the sequence, wherein the index value is mapped to the data.

The reception component 1102 may receive an indication of one or more configuration parameters associated with the SIP.

The transmission component 1104 may transmit a capability report indicating one or more capabilities of the UE associated with the multi-level balanced code.

The reception component 1102 may receive an indication of one or more parameters associated with the SIP, wherein the one or more parameters include at least one of the multiple sum values, a quantity of ports, a span of symbols associated with the SIP, an indication of resource blocks associated with the SIP, a length of the codewords, a constellation type, mapping of the codewords inside a resource block, a trellis diagram associated with the multi-level balanced code, a type of pilot port multiplexing, an indication of an allocated power for transmissions compared to a power associated with the data, or a beam identifier.

The reception component 1102 may receive downlink control information scheduling a communication that includes the data, wherein the downlink control information indicates the multi-level balanced code and a pilot pattern associated with the SIP.

The number and arrangement of components shown in FIG. 11 are provided as an example. In practice, there may be additional components, fewer components, different components, or differently arranged components than those shown in FIG. 11. Furthermore, two or more components shown in FIG. 11 may be implemented within a single component, or a single component shown in FIG. 11 may be implemented as multiple, distributed components. Additionally, or alternatively, a set of (one or more) components shown in FIG. 11 may perform one or more functions described as being performed by another set of components shown in FIG. 11.

Figure 12:
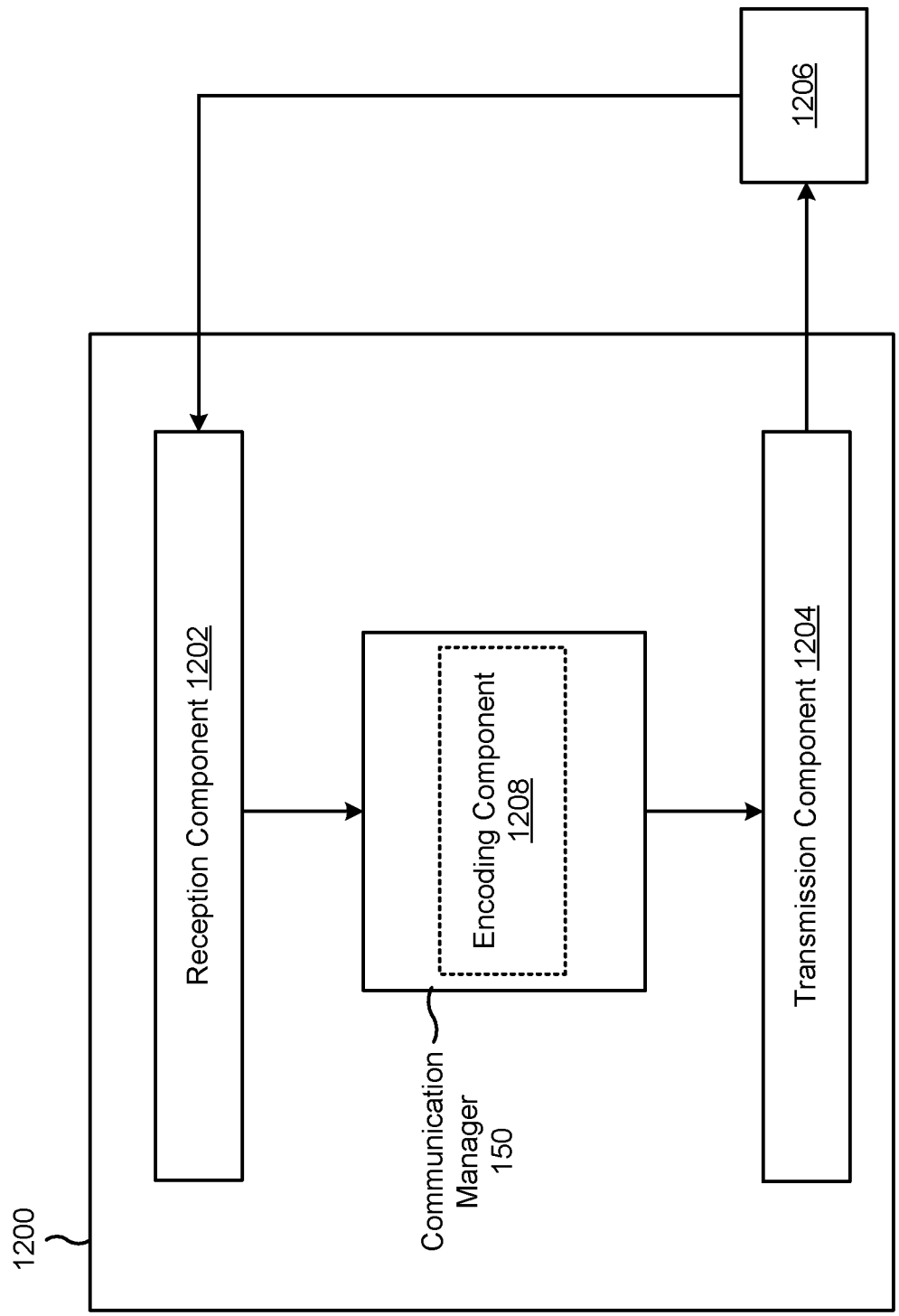
FIG. 12 is a diagram of an example apparatus for wireless communication, in accordance with the present disclosure.

FIG. 12 is a diagram of an example apparatus 1200 for wireless communication, in accordance with the present disclosure. The apparatus 1200 may be a network node, or a network node may include the apparatus 1200. In some aspects, the apparatus 1200 includes a reception component 1202 and a transmission component 1204, which may be in communication with one another (for example, via one or more buses and/or one or more other components). As shown, the apparatus 1200 may communicate with another apparatus 1206 (such as a UE, a base station, or another wireless communication device) using the reception component 1202 and the transmission component 1204. As further shown, the apparatus 1200 may include the communication manager 150. The communication manager 150 may include one or more of an encoding component 1208, among other examples.

In some aspects, the apparatus 1200 may be configured to perform one or more operations described herein in connection with FIGS. 7-8. Additionally, or alternatively, the apparatus 1200 may be configured to perform one or more processes described herein, such as process 1000 of FIG. 10, or a combination thereof. In some aspects, the apparatus 1200 and/or one or more components shown in FIG. 12 may include one or more components of the network node described in connection with FIG. 2. Additionally, or alternatively, one or more components shown in FIG. 12 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1202 may receive communications, such as reference signals, control information, data communications, or a combination thereof, from the apparatus 1206. The reception component 1202 may provide received communications to one or more other components of the apparatus 1200. In some aspects, the reception component 1202 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1200. In some aspects, the reception component 1202 may include one or more antennas, a modem, a demodulator, a MIMO detector, a receive processor, a controller/processor, a memory, or a combination thereof, of the network node described in connection with FIG. 2.

The transmission component 1204 may transmit communications, such as reference signals, control information, data communications, or a combination thereof, to the apparatus 1206. In some aspects, one or more other components of the apparatus 1200 may generate communications and may provide the generated communications to the transmission component 1204 for transmission to the apparatus 1206. In some aspects, the transmission component 1204 may perform signal processing on the generated communications (such as filtering, amplification, modulation, digital-to-analog conversion, multiplexing, interleaving, mapping, or encoding, among other examples), and may transmit the processed signals to the apparatus 1206. In some aspects, the transmission component 1204 may include one or more antennas, a modem, a modulator, a transmit MIMO processor, a transmit processor, a controller/processor, a memory, or a combination thereof, of the network node described in connection with FIG. 2. In some aspects, the transmission component 1204 may be co-located with the reception component 1202 in a transceiver.

The transmission component 1204 may transmit data associated with a UE, the data being encoded based on a multi-level balanced code, codewords of the multi-level balanced code being selected based on a finite number of multiple sum values, corresponding to all constellation symbol sequences in the multi-level balanced code. The transmission component 1204 may transmit a SIP using communication resources occupied by the data.

The encoding component 1208 may encode the data encoded based on the multi-level balanced code using a trellis diagram associated with the multi-level balanced code, wherein encoding the data includes identifying an index value associated with a codeword of the multi-level balanced code; and identifying, at each stage of a trellis diagram associated with the multi-level balanced code, a sequence value to be included in a sequence of the codeword based on the index value.

The transmission component 1204 may transmit an indication of one or more configuration parameters associated with the SIP.

The reception component 1202 may receive a capability report indicating one or more capabilities of the UE associated with the multi-level balanced code.

The transmission component 1204 may transmit an indication of one or more parameters associated with the SIP, wherein the one or more parameters include at least one of the multiple sum values, a quantity of ports, a span of symbols associated with the SIP, an indication of resource blocks associated with the SIP, a length of the codewords, a constellation type, how to map the codewords inside a resource block, a trellis diagram associated with the multi-level balanced code, a type of pilot port multiplexing, an indication of an allocated power for transmissions compared to a power associated with the data, or a beam identifier.

The transmission component 1204 may transmit downlink control information scheduling a communication that includes the data, wherein the downlink control information indicates the multi-level balanced code and a pilot pattern associated with the SIP.

The number and arrangement of components shown in FIG. 12 are provided as an example. In practice, there may be additional components, fewer components, different components, or differently arranged components than those shown in FIG. 12. Furthermore, two or more components shown in FIG. 12 may be implemented within a single component, or a single component shown in FIG. 12 may be implemented as multiple, distributed components. Additionally, or alternatively, a set of (one or more) components shown in FIG. 12 may perform one or more functions described as being performed by another set of components shown in FIG. 12.

The following provides an overview of some Aspects of the present disclosure:

Aspect 1: A method of wireless communication performed by a user equipment (UE), comprising: receiving data encoded based on a multi-level balanced code, codewords of the multi-level balanced code being selected based on a finite number of multiple sum values, corresponding to all constellation symbol sequences in the multi-level balanced code; receiving a superimposed pilot (SIP) using communication resources occupied by the data; and estimating one or more channel parameters based on the SIP and the multi-level balanced code.

Aspect 2: The method of Aspect 1, wherein the finite number is less than a threshold relative to a number of codewords in the multi-level balanced code.

Aspect 3: The method of any of Aspects 1-2, further comprising: decoding the data encoded based on the multi-level balanced code using a trellis diagram associated with the multi-level balanced code, wherein decoding the data includes: identifying a codeword associated with the multi-level balanced code, wherein the codeword is associated with a sequence; and calculating an index value associated with the codeword based at least in part on aggregating, for each stage of the trellis diagram, sums of proceeding paths connected to a symbol associated with respective elements in the sequence, wherein the index value is mapped to the data.

Aspect 4: The method of Aspect 3, wherein calculating the index value comprises: calculating, at each stage of the trellis diagram, a sum of proceeding paths for all nodes in the trellis diagram that are connected to allowed symbols that are prior to a node associated with a sequence element of the sequence; and updating a counter associated with calculating the index value with the sum of the proceeding paths.

Aspect 5: The method of any of Aspects 1-4, further comprising: receiving an indication of one or more configuration parameters associated with the SIP.

Aspect 6: The method of Aspect 1, further comprising: transmitting a capability report indicating one or more capabilities of the UE associated with the multi-level balanced code.

Aspect 7: The method of Aspect 6, wherein the one or more capabilities include an indication of support for at least one of: the multi-level balanced code, SIPS included in signals, a quantity of supported values for balancing sequences of the codewords, an indication of one or more supported values for balancing the sequences, a quantity of superimposed ports associated with the signals, or a length of the sequences.

Aspect 8: The method of any of Aspects 1-7, further comprising: receiving an indication of one or more parameters associated with the SIP, wherein the one or more parameters include at least one of: the multiple sum values, a quantity of ports, a span of symbols associated with the SIP, an indication of resource blocks associated with the SIP, a length of the codewords, a constellation type, mapping of the codewords inside a resource block, a trellis diagram associated with the multi-level balanced code, a type of pilot port multiplexing, an indication of an allocated power for transmissions compared to a power associated with the data, or a beam identifier.

Aspect 9: The method of any of Aspects 1-8, further comprising: receiving downlink control information scheduling a communication that includes the data, wherein the downlink control information indicates the multi-level balanced code and a pilot pattern associated with the SIP.

Aspect 10: The method of any of Aspects 1-9, wherein a sequence of a codeword of the data includes values of the sequence that sum to a value included in the multiple sum values.

Aspect 11: The method of any of Aspects 1-10, wherein the multiple sum values include zero and one or more other values.

Aspect 12: The method of any of Aspects 1-11, wherein receiving the data comprises: obtaining a trellis diagram associated with the multi-level balanced code based at least in part on one or more parameters.

Aspect 13: The method of Aspect 12, wherein the one or more parameters include at least one of: a constellation associated with the multi-level balanced code, a sequence length associated with the codewords, or the multiple sum values.

Aspect 14: The method of any of Aspects 12-13, wherein obtaining the trellis diagram comprises: identifying, for each stage of the trellis diagram, one or more valid partial sums; identifying, for each valid partial sum of the one or more valid partial sums, one or more allowed symbols in a constellation associated with the trellis diagram, wherein an allowed symbol is a symbol that results in a valid partial sum at a next stage of the trellis diagram when combined with a valid partial sum at a current stage of the trellis diagram; and identifying, for each valid partial sum of the one or more valid partial sums, one or more proceeding paths, wherein a proceeding path is a path leading to a partial sum at the next stage where a difference between the partial sum at the next stage and a partial sum at the current stage is a constellation point in the constellation, wherein a node in the current stage includes a valid partial sum, from the one or more valid partial sums and the one or more proceeding paths, wherein the node is associated with one or more edges corresponding to allowed symbols, from the one or more allowed symbols, for the valid partial sum.

Aspect 15: The method of Aspect 14, wherein the one or more valid partial sums include partial sums where: a difference between the partial sums and at least one partial sum of the next stage of the trellis diagram is equal to one of one or more constellation points in the constellation, and the partial sums are less than a current stage number multiplied by a highest value constellation point in the constellation and not less than the current stage number multiplied by a lowest value constellation point in the constellation.

Aspect 16: A method of wireless communication performed by a network node, comprising: transmitting data associated with a user equipment (UE), the data being encoded based on a multi-level balanced code, codewords of the multi-level balanced code being selected based on a finite number of multiple sum values, corresponding to all constellation symbol sequences in the multi-level balanced code; and transmitting a superimposed pilot (SIP) using communication resources occupied by the data.

Aspect 17: The method of Aspect 16, wherein the finite number is less than a threshold relative to a number of codewords in the multi-level balanced code.

Aspect 18: The method of any of Aspects 16-17, further comprising: encoding the data encoded based on the multi-level balanced code using a trellis diagram associated with the multi-level balanced code, wherein encoding the data includes: identifying an index value associated with a codeword of the multi-level balanced code; and identifying, at each stage of a trellis diagram associated with the multi-level balanced code, a sequence value to be included in a sequence of the codeword based on the index value.

Aspect 19: The method of Aspect 18, wherein identifying the sequence value to be included in the sequence of the codeword comprises: setting a value of a counter to the index value; calculating cumulative sums of proceeding paths for each node in a current stage of the trellis diagram; calculating a first cumulative sum, from the cumulative sums, that is less than the value of the counter and is closest to the value of the counter; identifying that the sequence value is a value of a node, from each node in the current stage, associated with the first cumulative sum; and updating the value of the counter to an updated value by subtracting the first cumulative sum.

Aspect 20: The method of Aspect 19, wherein encoding the data comprises: identifying a next sequence value to be included in the sequence of the codeword based on: calculating cumulative sums of proceeding paths for each node in a next stage of the trellis diagram; identifying a second cumulative sum, from the cumulative sums associated with the next stage, that is less than the updated value of the counter and is closest to the updated value of the counter; identifying that the next sequence value is a value of a node, from each node in the next stage, associated with the second cumulative sum; and updating the updated value of the counter by subtracting the second cumulative sum.

Aspect 21: The method of any of Aspects 16-20, further comprising: transmitting an indication of one or more configuration parameters associated with the SIP.

Aspect 22: The method of any of Aspects 16-21, further comprising: receiving a capability report indicating one or more capabilities of the UE associated with the multi-level balanced code.

Aspect 23: The method of Aspect 22, wherein the one or more capabilities include an indication of support for at least one of: the multi-level balanced code, SIPS included in signals, a quantity of supported values for balancing sequences of the codewords, an indication of one or more supported values for balancing the sequences, a quantity of superimposed ports associated with the signals, or a length of the sequences.

Aspect 24: The method of any of Aspects 16-23, further comprising: transmitting an indication of one or more parameters associated with the SIP, wherein the one or more parameters include at least one of: the multiple sum values, a quantity of ports, a span of symbols associated with the SIP, an indication of resource blocks associated with the SIP, a length of the codewords, a constellation type, how to map the codewords inside a resource block, a trellis diagram associated with the multi-level balanced code, a type of pilot port multiplexing, an indication of an allocated power for transmissions compared to a power associated with the data, or a beam identifier.

Aspect 25: The method of any of Aspects 16-24, further comprising: transmitting downlink control information scheduling a communication that includes the data, wherein the downlink control information indicates the multi-level balanced code and a pilot pattern associated with the SIP.

Aspect 26: The method of any of Aspects 16-25, wherein a sequence of a codeword of the data includes values of the sequence that sum to a value included in the multiple sum values.

Aspect 27: The method of any of Aspects 16-26, wherein the multiple sum values include zero and one or more other values.

Aspect 28: The method of any of Aspects 16-27, wherein transmitting the data comprises: obtaining a trellis diagram associated with the multi-level balanced code based at least in part on one or more parameters.

Aspect 29: The method of Aspect 28, wherein the one or more parameters include at least one of: a constellation associated with the multi-level balanced code, a sequence length associated with the codewords, or the multiple sum values.

Aspect 30: The method of any of Aspects 28-29, wherein obtaining the trellis diagram comprises: identifying, for each stage of the trellis diagram, one or more valid partial sums; identifying, for each valid partial sum of the one or more valid partial sums, one or more allowed symbols in a constellation associated with the trellis diagram, wherein an allowed symbol is a symbol that results in a valid partial sum at a next stage of the trellis diagram when combined with a valid partial sum at a current stage of the trellis diagram; and identifying, for each valid partial sum of the one or more valid partial sums, one or more proceeding paths, wherein a proceeding path is a path leading to a partial sum at the next stage where a difference between the partial sum at the next stage and a partial sum at the current stage is a constellation point in the constellation, wherein a node in the current stage includes a valid partial sum, from the one or more valid partial sums and the one or more proceeding paths, wherein the node is associated with one or more edges corresponding to allowed symbols, from the one or more allowed symbols, for the valid partial sum.

Aspect 31: The method of Aspect 30, wherein the one or more valid partial sums include partial sums where: a difference between the partial sums and at least one partial sum of the next stage of the trellis diagram is equal to one of one or more constellation points in the constellation, and the partial sums are less than a current stage number multiplied by a highest value constellation point in the constellation and not less than the current stage number multiplied by a lowest value constellation point in the constellation.

Aspect 32: An apparatus for wireless communication at a device, comprising a processor; memory coupled with the processor; and instructions stored in the memory and executable by the processor to cause the apparatus to perform the method of one or more of Aspects 1-15.

Aspect 33: A device for wireless communication, comprising a memory and one or more processors coupled to the memory, the one or more processors configured to perform the method of one or more of Aspects 1-15.

Aspect 34: An apparatus for wireless communication, comprising at least one means for performing the method of one or more of Aspects 1-15.

Aspect 35: A non-transitory computer-readable medium storing code for wireless communication, the code comprising instructions executable by a processor to perform the method of one or more of Aspects 1-15.

Aspect 36: A non-transitory computer-readable medium storing a set of instructions for wireless communication, the set of instructions comprising one or more instructions that, when executed by one or more processors of a device, cause the device to perform the method of one or more of Aspects 1-15.

Aspect 37: An apparatus for wireless communication at a device, comprising a processor; memory coupled with the processor; and instructions stored in the memory and executable by the processor to cause the apparatus to perform the method of one or more of Aspects 16-31.

Aspect 38: A device for wireless communication, comprising a memory and one or more processors coupled to the memory, the one or more processors configured to perform the method of one or more of Aspects 16-31.

Aspect 39: An apparatus for wireless communication, comprising at least one means for performing the method of one or more of Aspects 16-31.

Aspect 40: A non-transitory computer-readable medium storing code for wireless communication, the code comprising instructions executable by a processor to perform the method of one or more of Aspects 16-31.

Aspect 41: A non-transitory computer-readable medium storing a set of instructions for wireless communication, the set of instructions comprising one or more instructions that, when executed by one or more processors of a device, cause the device to perform the method of one or more of Aspects 16-31.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A user equipment (UE) for wireless communication, comprising:
   a memory; and
   one or more processors, coupled to the memory, configured to:
      receive data encoded based on a multi-level balanced code, codewords of the multi-level balanced code being selected based on a finite number of multiple sum values, corresponding to all constellation symbol sequences in the multi-level balanced code;
      receive a superimposed pilot (SIP) using communication resources occupied by the data; and
      estimate one or more channel parameters based on the SIP and the multi-level balanced code.

2. The UE of claim 1, wherein the finite number is less than a threshold relative to a number of codewords in the multi-level balanced code.

3. The UE of claim 1, wherein the one or more processors are further configured to:
   decode the data encoded based on the multi-level balanced code using a trellis diagram associated with the multi-level balanced code, wherein the one or more processors, to decode the data, are configured to:
      identify a codeword associated with the multi-level balanced code, wherein the codeword is associated with a sequence; and
      calculate an index value associated with the codeword based at least in part on aggregating, for each stage of the trellis diagram, sums of proceeding paths connected to a symbol associated with respective elements in the sequence, wherein the index value is mapped to the data.

4. The UE of claim 3, wherein the one or more processors, to calculate the index value, are configured to:
   calculate, at each stage of the trellis diagram, a sum of proceeding paths for all nodes in the trellis diagram that are connected to allowed symbols that are prior to a node associated with a sequence element of the sequence; and
   update a counter associated with calculating the index value with the sum of the proceeding paths.

5. The UE of claim 1, wherein the one or more processors are further configured to:
   transmit a capability report indicating one or more capabilities of the UE associated with the multi-level balanced code.

6. The UE of claim 5, wherein the one or more capabilities include an indication of support for at least one of:
   the multi-level balanced code, SIPS included in signals,
a quantity of supported values for balancing sequences of the codewords,
an indication of one or more supported values for balancing the sequences,
a quantity of superimposed ports associated with the signals, or
a length of the sequences.

7. The UE of claim 1, wherein the one or more processors are further configured to:
receive an indication of one or more parameters associated with the SIP, wherein the one or more parameters include at least one of:
the multiple sum values,
a quantity of ports,
a span of symbols associated with the SIP,
an indication of resource blocks associated with the SIP,
a length of the codewords,
a constellation type,
mapping of the codewords inside a resource block,
a trellis diagram associated with the multi-level balanced code,
a type of pilot port multiplexing,
an indication of an allocated power for transmissions compared to a power associated with the data, or
a beam identifier.

8. The UE of claim 1, wherein the one or more processors are further configured to:
receive downlink control information scheduling a communication that includes the data, wherein the downlink control information indicates the multi-level balanced code and a pilot pattern associated with the SIP.

9. The UE of claim 1, wherein a sequence of a codeword of the data includes values of the sequence that sum to a value included in the multiple sum values.

10. The UE of claim 1, wherein the one or more processors, to receive the data, are configured to:
obtain a trellis diagram associated with the multi-level balanced code based at least in part on one or more parameters.

11. A network node for wireless communication, comprising:
a memory; and
one or more processors, coupled to the memory, configured to:
transmit data associated with a user equipment (UE), the data being encoded based on a multi-level balanced code, codewords of the multi-level balanced code being selected based on a finite number of multiple sum values, corresponding to all constellation symbol sequences in the multi-level balanced code; and
transmit a superimposed pilot (SIP) using communication resources occupied by the data.

12. The network node of claim 11, wherein the one or more processors are further configured to:
encode the data encoded based on the multi-level balanced code using a trellis diagram associated with the multi-level balanced code, wherein the one or more processors, to encode the data, are configured to:
identify an index value associated with a codeword of the multi-level balanced code; and
identify, at each stage of a trellis diagram associated with the multi-level balanced code, a sequence value to be included in a sequence of the codeword based on the index value.

13. The network node of claim 12, wherein the one or more processors, to identify the sequence value to be included in the sequence of the codeword, are configured to:
set a value of a counter to the index value;
calculate cumulative sums of proceeding paths for each node in a current stage of the trellis diagram;
calculate a first cumulative sum, from the cumulative sums, that is less than the value of the counter and is closest to the value of the counter;
identify that the sequence value is a value of a node, from each node in the current stage, associated with the first cumulative sum; and
update the value of the counter to an updated value by subtracting the first cumulative sum.

14. The network node of claim 13, wherein the one or more processors, to encode the data, are configured to:
identify a next sequence value to be included in the sequence of the codeword, and wherein the one or more processors, to identify the next sequence value, are configured to:
calculate cumulative sums of proceeding paths for each node in a next stage of the trellis diagram;
identify a second cumulative sum, from the cumulative sums associated with the next stage, that is less than the updated value of the counter and is closest to the updated value of the counter;
identify that the next sequence value is a value of a node, from each node in the next stage, associated with the second cumulative sum; and
update the updated value of the counter by subtracting the second cumulative sum.

15. The network node of claim 11, wherein the one or more processors, to transmit the data, are configured to:
obtain a trellis diagram associated with the multi-level balanced code based at least in part on one or more parameters.

16. The network node of claim 15, wherein the one or more parameters include at least one of:
a constellation associated with the multi-level balanced code,
a sequence length associated with the codewords, or
the multiple sum values.

17. The network node of claim 15, wherein the one or more processors, to obtain the trellis diagram, are configured to:
identify, for each stage of the trellis diagram, one or more valid partial sums;
identify, for each valid partial sum of the one or more valid partial sums, one or more allowed symbols in a constellation associated with the trellis diagram, wherein an allowed symbol is a symbol that results in a valid partial sum at a next stage of the trellis diagram when combined with a valid partial sum at a current stage of the trellis diagram; and
identify, for each valid partial sum of the one or more valid partial sums, one or more proceeding paths, wherein a proceeding path is a path leading to a partial sum at the next stage where a difference between the partial sum at the next stage and a partial sum at the current stage is a constellation point in the constellation,
wherein a node in the current stage includes a valid partial sum, from the one or more valid partial sums and the one or more proceeding paths, wherein the node is associated with one or more edges corresponding to allowed symbols, from the one or more allowed symbols, for the valid partial sum.

18. A method of wireless communication performed by a user equipment (UE), comprising:
- receiving data encoded based on a multi-level balanced code, codewords of the multi-level balanced code being selected based on a finite number of multiple sum values, corresponding to all constellation symbol sequences in the multi-level balanced code;
- receiving a superimposed pilot (SIP) using communication resources occupied by the data; and
- estimating one or more channel parameters based on the SIP and the multi-level balanced code.

19. The method of claim 18, further comprising:
- decoding the data encoded based on the multi-level balanced code using a trellis diagram associated with the multi-level balanced code, wherein decoding the data includes:
  - identifying a codeword associated with the multi-level balanced code, wherein the codeword is associated with a sequence; and
  - calculating an index value associated with the codeword based at least in part on aggregating, for each stage of the trellis diagram, sums of proceeding paths connected to a symbol associated with respective elements in the sequence, wherein the index value is mapped to the data.

20. The method of claim 18, further comprising:
- transmitting a capability report indicating one or more capabilities of the UE associated with the multi-level balanced code.

21. The method of claim 18, further comprising:
- receiving an indication of one or more parameters associated with the SIP, wherein the one or more parameters include at least one of:
  - the multiple sum values,
  - a quantity of ports,
  - a span of symbols associated with the SIP,
  - an indication of resource blocks associated with the SIP,
  - a length of the codewords,
  - a constellation type,
  - mapping of the codewords inside a resource block,
  - a trellis diagram associated with the multi-level balanced code,
  - a type of pilot port multiplexing,
  - an indication of an allocated power for transmissions compared to a power associated with the data, or
  - a beam identifier.

22. The method of claim 18, further comprising:
- receiving downlink control information scheduling a communication that includes the data, wherein the downlink control information indicates the multi-level balanced code and a pilot pattern associated with the SIP.

23. The method of claim 18, wherein a sequence of a codeword of the data includes values of the sequence that sum to a value included in the multiple sum values.

24. The method of claim 18, wherein receiving the data comprises:
- obtaining a trellis diagram associated with the multi-level balanced code based at least in part on one or more parameters.

25. The method of claim 24, wherein obtaining the trellis diagram comprises:
- identifying, for each stage of the trellis diagram, one or more valid partial sums;
- identifying, for each valid partial sum of the one or more valid partial sums, one or more allowed symbols in a constellation associated with the trellis diagram, wherein an allowed symbol is a symbol that results in a valid partial sum at a next stage of the trellis diagram when combined with a valid partial sum at a current stage of the trellis diagram; and
- identifying, for each valid partial sum of the one or more valid partial sums, one or more proceeding paths, wherein a proceeding path is a path leading to a partial sum at the next stage where a difference between the partial sum at the next stage and a partial sum at the current stage is a constellation point in the constellation,
- wherein a node in the current stage includes a valid partial sum, from the one or more valid partial sums and the one or more proceeding paths, wherein the node is associated with one or more edges corresponding to allowed symbols, from the one or more allowed symbols, for the valid partial sum.

26. A method of wireless communication performed by a network node, comprising:
- transmitting data associated with a user equipment (UE), the data being encoded based on a multi-level balanced code, codewords of the multi-level balanced code being selected based on a finite number of multiple sum values, corresponding to all constellation symbol sequences in the multi-level balanced code; and
- transmitting a superimposed pilot (SIP) using communication resources occupied by the data.

27. The method of claim 26, further comprising:
- receiving a capability report indicating one or more capabilities of the UE associated with the multi-level balanced code.

28. The method of claim 26, wherein transmitting the data comprises:
- obtaining a trellis diagram associated with the multi-level balanced code based at least in part on one or more parameters.

29. The method of claim 28, wherein obtaining the trellis diagram comprises:
- identifying, for each stage of the trellis diagram, one or more valid partial sums;
- identifying, for each valid partial sum of the one or more valid partial sums, one or more allowed symbols in a constellation associated with the trellis diagram, wherein an allowed symbol is a symbol that results in a valid partial sum at a next stage of the trellis diagram when combined with a valid partial sum at a current stage of the trellis diagram; and
- identifying, for each valid partial sum of the one or more valid partial sums, one or more proceeding paths, wherein a proceeding path is a path leading to a partial sum at the next stage where a difference between the partial sum at the next stage and a partial sum at the current stage is a constellation point in the constellation,
  - wherein a node in the current stage includes a valid partial sum, from the one or more valid partial sums and the one or more proceeding paths, wherein the node is associated with one or more edges corresponding to allowed symbols, from the one or more allowed symbols, for the valid partial sum.

30. The method of claim 29, wherein the one or more valid partial sums include partial sums where:
- a difference between the partial sums and at least one partial sum of the next stage of the trellis diagram is equal to one of one or more constellation points in the constellation, and the partial sums are less than a current stage number multiplied by a highest value constellation point in the constellation and not less than the current stage number multiplied by a lowest value constellation point in the constellation.

* * * * *